United States Patent
Monahan et al.

(10) Patent No.: US 9,595,419 B1
(45) Date of Patent: *Mar. 14, 2017

(54) ALIGNMENT AND REGISTRATION TARGETS FOR MULTIPLE-COLUMN CHARGED PARTICLE BEAM LITHOGRAPHY AND INSPECTION

(71) Applicant: Multibeam Corporation, Santa Clara, CA (US)

(72) Inventors: Kevin M. Monahan, Cupertino, CA (US); Michael C. Smayling, Fremont, CA (US); Theodore A. Prescop, San Jose, CA (US); David K. Lam, Saratoga, CA (US)

(73) Assignee: Multibeam Corporation, Santa Clara, CA (US)

( * ) Notice: Subject to any disclaimer, the term of this patent is extended or adjusted under 35 U.S.C. 154(b) by 301 days.

This patent is subject to a terminal disclaimer.

(21) Appl. No.: 14/522,563

(22) Filed: Oct. 23, 2014

Related U.S. Application Data

(60) Provisional application No. 61/910,021, filed on Nov. 27, 2013, provisional application No. 61/975,721, filed on Apr. 4, 2014.

(51) Int. Cl.
*H01J 37/22* (2006.01)
*H01J 37/26* (2006.01)

(52) U.S. Cl.
CPC .......... *H01J 37/222* (2013.01); *H01J 37/261* (2013.01); *H01J 2237/063* (2013.01); *H01J 2237/2611* (2013.01)

(58) Field of Classification Search
None
See application file for complete search history.

(56) References Cited

U.S. PATENT DOCUMENTS 9,478,395 B1 * 10/2016 Monahan ............ H01J 37/222
250/307
2005/0094863 A1 * 5/2005 Bergman Reuter .... G06T 7/001
382/145

(Continued)

OTHER PUBLICATIONS

Rafael C. Gonzalez and Richard E. Woods, Digital Image Processing, 1992, pp. 128-143, Addison-Wesley.

(Continued)

*Primary Examiner* — Steven H Whitesell Gordon
(74) *Attorney, Agent, or Firm* — Seth A. Horwitz

(57) ABSTRACT

The present application discloses methods, systems and devices for using charged particle beam tools to pattern and inspect a substrate. The inventors have discovered that it is highly advantageous to use patterns generated using the Hadamard transform as alignment and registration marks (Hadamard targets) for multiple-column charged particle beam lithography and inspection tools. Further, superior substrate alignment and layer-to-layer pattern registration accuracy can be achieved using Hadamard targets patterned in edge-proximal portions of the substrate that are typically stripped bare of resist prior to lithography, in addition to Hadamard targets patterned in inner substrate portions. High-order Hadamard targets can also be patterned and imaged to obtain superior column performance metrics for applications such as super-rapid beam calibration DOE, column matching, and column performance tracking. Superior alignment and registration, and column parameter optimization, allow significant yield gains.

45 Claims, 33 Drawing Sheets

(56) References Cited

U.S. PATENT DOCUMENTS

| | | | | |
|---|---|---|---|---|
| 2006/0023932 A1* | 2/2006 | DeMaris | ............. | G06F 17/5081 |
| | | | | 382/145 |
| 2008/0034339 A1* | 2/2008 | Lehner | ................ | G06F 17/5081 |
| | | | | 716/136 |
| 2010/0117001 A1* | 5/2010 | Looije | ................ | G03F 7/70508 |
| | | | | 250/395 |
| 2014/0180462 A1* | 6/2014 | Belledent | .............. | G03F 7/2061 |
| | | | | 700/98 |

OTHER PUBLICATIONS

Yoann Blancquaert and Christophe Dezauzier, "Diffraction based overlay and image based overlay on production flow for advanced technology node.", Proc. SPIE, vol. 8681, 2013.

Yen-Liang Chen, et al., "Reduction of image-based ADI-to-AEI overlay inconsistency with improved algorithm", Proc. SPIE vol. 8681, 2013.

Nuriel Amir, et al., "Multi layer overlay measurement recent developments", Proc. SPIE vol. 8681, 2013.

T. Kato, et al., "Fundamentals of overlay measurement and inspection using scanning electron-microscope", Proc. SPIE vol. 8681, 2013.

Charlie Chen, et al., "DCM: device correlated metrology for overlay measurements", Proc. SPIE vol. 8681, 2013.

Osamu Inoue, et al., "In-die overlay metrology by using CD-SEM", Proc. SPIE vol. 8681, 2013.

Cen Shawn Wu, et al., "High-energy electron beam lithography for nanoscale fabrication", Lithography, INTECH, 2010.

\* cited by examiner

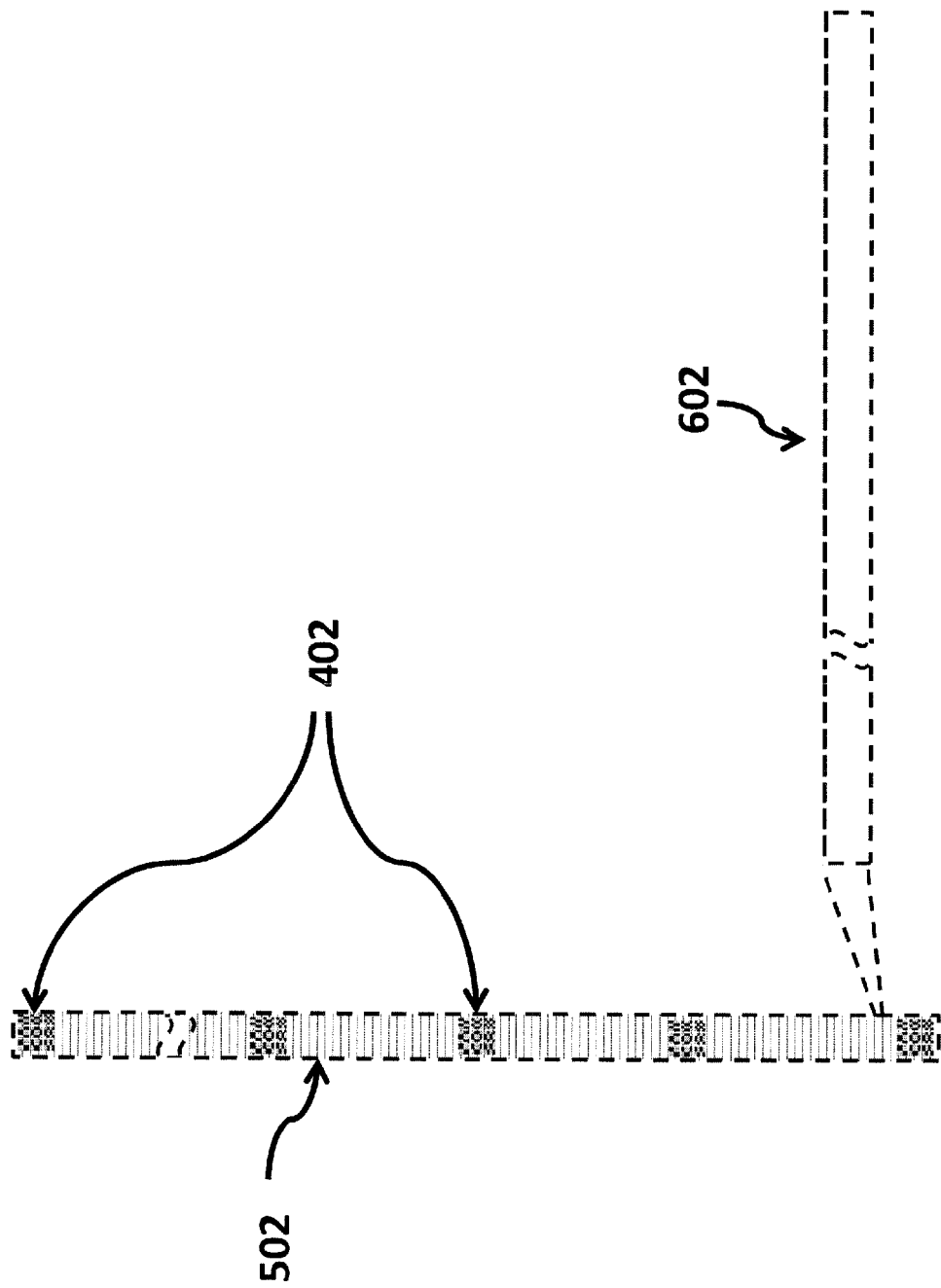

ALIGNMENT AND REGISTRATION TARGETS FOR MULTIPLE-COLUMN CHARGED PARTICLE BEAM LITHOGRAPHY AND INSPECTION

CROSS-REFERENCE

This application is a non-provisional of, and claims priority from, U.S. Provisional App. No. 61/975,721, filed Apr. 4, 2014; and U.S. Provisional App. No. 61/910,021, filed Nov. 27, 2013; which are hereby incorporated by reference.

BACKGROUND

The present application relates to systems, devices and methods for lithographic patterning and inspection using charged particle beams; and more particularly to alignment and registration of multiple charged particle beam columns with respect to a semiconductor wafer or other substrate, and/or to previously written patterns thereon.

Note that the points discussed below may reflect the hindsight gained from the disclosed inventions, and are not necessarily admitted to be prior art.

FIG. 2A shows an example of a wafer 200 being scanned by multiple electron beams 204 (e-beams) emitted by respective beam columns 206 (e-beam columns, see FIG. 2B). A patterned or unpatterned wafer 200 (or other substrate) is independently and simultaneously scanned by multiple columns 206 to either write or inspect the wafer 200. Columns 206 can be separately controlled—e.g., with different deflections and different blanking timings. (One of skill in the art will recognize that a wide variety of other control options are available per-column.) When writing a wafer 200 (or other substrate), the columns 206 emit electron beams 204 at a power level sufficient to change certain properties of a resist layer coated on the substrate so that after the resist is developed (in ways similar to developing a photographic film), etch steps can take place. When inspecting a wafer 200, the columns 206 emit electron beams 204 (generally at a lower power level than when writing) and detect an image of the substrate surface caused by the resulting scattered electrons. Individual columns 206 are able to target a portion 202 of the substrate surface with their respectively emitted beams 204.

In preferred embodiments, the array of electron beam columns 206 is stationary, the stage holding the wafer 200 moves back and forth, and the electron beam column 206 moves the beam 204 across the wafer 200 to write or to perform imaging (the latter during, e.g., alignment or registration, or wafer inspection). The beam motion across the wafer 200 can be, for example, vector scanning to a target feature or "care-area" containing a target feature, and raster scanning across the target feature while writing or inspecting. Preferably, each column 206 has its own detector and control computer. Vector-raster scanning, care-areas, and use of multiple control computers local to respective columns are disclosed in U.S. patent application Ser. No. 14/085,768, which is incorporated herein by reference.

As mentioned above, after e-beams 204 write features to a substrate, the substrate needs to be treated with resist development followed by etch steps in order to complete the writing process. (Herein, the immediate results of e-beam writing are called "features", and continue to be called "features" throughout the lithography process, including after develop and/or etch.)

Herein, in some instances, develop and/or etch and/or other crucial steps are not explicitly described with respect to lithography and inspection. It will be understood by those skilled in the art that these steps (e.g., develop and etch) are performed when appropriate, and can be omitted from discussion for clarity of explanation. Further, a substrate being "written" by e-beams 204 means that the resist layer coating the substrate is exposed to the e-beams 204. Inspection (also referred to herein as "imaging") of features on the substrate always occurs AFTER at least a resist development step (sometimes referred to as just development), and can also occur after develop and etch.

Generally, in resist development, the resist coated substrate is immersed in or otherwise in contact with liquid chemical (resist developer solution), followed by rinsing. Certain properties of the resist are changed by e-beam exposure such that the e-beam-exposed area either becomes soluble in resist developer solution ("positive" resist, which is insoluble until exposed to e-beams) or becomes insoluble in resist developer solution ("negative" resist, which is soluble until exposed to e-beams). When a positive resist is exposed to e-beams, the unexposed portions remain insoluble, and will be left intact after the substrate is washed with resist developer solution. When a negative resist is exposed to e-beams, the unexposed portions remain soluble, and will be washed away by resist developer solution, leaving the e-beam-exposed portions intact.

As a result of resist development, a pattern will emerge on the substrate comprising many features written by the e-beam lithography tool. E-beams can then be used to inspect these features for defects. Inspection after development is also known as after-develop inspection (ADI).

Etch follows resist development. In etching, material exposed to the etch environment is removed, while material protected by developed resist is not etched. Inspection after etch is also known as after-etch inspection (AEI).

Both lithography (optical, e-beam and otherwise) and etch can introduce process-dependent defects to the patterned substrate. Generally, process-induced defects are defects introduced during wafer handling, resist spin and heating, lithography, resist development, etch, deposition, inspection, implantation, thermal processing, and chemical-mechanical polishing.

FIG. 2B shows an example of a wafer 200. The wafer 200 (or other substrate) is written or image data is gathered (beams are emitted) using columns 206 (columns 206 are shown via their center positions, represented here as plusses). Example die 208 size and column 206 center-to-center spacing 210 (column separation) are shown. A regular grid of columns 206 can use different spacing 210 in different (orthogonal) directions. Die 208 size and column separation 210 are not required to (and generally, will not) correspond. Column separation 210 generally corresponds to the substrate area 202 targetable by beams 204 emitted from respective columns 206.

Wafer 200 lithography and inspection using electron beams 202 can be made highly parallelized by using multiple electron beams 202. Electron beams 202 emitted by columns 206 in a multiple column 206 array can be independently and simultaneously scanned across the wafer 200 using electrostatic deflectors, preferably using distributed column control systems (e.g., local column control computers, as described hereinabove with respect to FIG. 2A).

The multiple column 206 array comprises electron beam columns 206 arranged in a regular grid. For example, column 206 arrays with center-to-center column spacing 210 of 30 mm×30 mm have been implemented, though other column spacings 210 (e.g., 24 mm×33 mm) can also be used.

A column 206 can be configured to scan a die 208 (IC), part of a die 208, or multiple dies 208 during inspection. Each die 208 can be scanned by one or more columns 206, depending on the column 206 writing area 202. The "writing area" is the area to which the column 206 can deflect its beam to obtain images or write pattern (depending on the capabilities of the column 206), taking into account wafer stage movement.

FIG. 2C schematically shows an example of a miniature e-beam column 220 comprising an electron gun 222, including an electron source and electron gun lens; deflection assembly 224; and main lens 226. A miniature e-beam column 220 can also include, for example, deflectors, apertures, blankers, other electron-optical components, column control electronics, electron detectors or other sensors, and/or other elements for column 220 operation, maintenance, and testing.

FIG. 2D shows an example of a multi-column e-beam lithography (EBL) or e-beam inspection (EBI) system 230 (also referred to herein as an EBL or EBI tool). This e-beam system comprises an array 232 of miniature e-beam columns 220, as well as a wafer loading/unloading mechanism 234 and a wafer stage 236. Other sub-systems that are used for EBL or EBI include control electronics, vacuum systems, alignment systems, vibration isolation and magnetic shielding.

FIG. 2E shows an example of a uni-directional (1-D) layout process using both optical and electron beam lithography. "1-D" refers to 1-D gridded design rule.

Apparent resolution limits of optical systems have resulted in a process of simplification of integrated circuit layouts in order to ensure printability as design rules shrink. At one time, pattern design common wisdom allowed lines to run in virtually any direction. Later, pattern design was largely restricted to perpendicular lines, often referred to as Manhattan geometries. As feature sizes shrink further, optical pattern design can advantageously be restricted to lines running in a single direction, with features perpendicular to the 1-D optical design formed in a complementary lithography step known as "cutting". The complementary step can be performed using a charged particle beam lithography tool comprising an array of columns—for example, electrostatically controlled miniature electron beam columns.

It is common to pattern the layout of 1-D designs by separating the 1-D design layout database into lines and cuts. A 1-D layout 242 is separated in the design layout database into a "line pattern" 244 and a "cut pattern" 246. The design layout database contains the information needed by lithography tools to pattern one or more layers on a substrate. A line pattern 244 generally comprises an array of unidirectional lines 248. Cut patterns 246 generally comprise linecuts and holes 250.

Line patterns 244 are written by an optical lithography system, which can be followed by other process steps to increase the density of lines on the substrate 252. Cut patterns are written by e-beam lithography 254 (e.g., miniature e-beam column lithography). Such use of e-beam lithography (which can also write via holes and contact holes) is also called complementary e-beam lithography, or CEBL. The combination of the line-forming process followed by line-cuts written with CEBL to pattern a substrate layer is called complementary lithography. Optical masks can be made without any information about the cuts. CEBL generally uses only the cut database.

The optically-printed 252 line pattern 248 and the e-beam-written 254 cut pattern 250 combine to form a 1-D layer 256 on the substrate that corresponds to the 1-D pattern 242 specified by the design layout database. Separating the pattern 242 this way uses the respective unique capabilities of optical lithography and e-beam lithography. Optical lithography can efficiently print uniform parallel lines over a large area of a substrate. E-beam lithography inherently can write smaller features more effectively than an optical lithography tool.

FIG. 2F schematically shows an example of a 1-D layout pattern 260. Here, line patterns 244 (printed by an optical lithography system) are shown as horizontal lines 262, while cut patterns 246 (written by a CEBL system) are shown as (generally, much shorter) vertical lines 264. Example spacing and line/cut widths are shown; other spacing and widths can be used (e.g., in more advanced processes).

FIG. 2G shows an example of a complementary lithography process 270. One or more multiple, miniature-column, e-beam lithography systems 230 are used in combination with an optical lithography system 272 and other wafer processing tools (e.g. resist development and etch tools) to pattern a wafer layer. Here, optical lithography tools 272 expose 274 1-D lines 248. (Several other processing steps not shown in this figure follow, e.g., involving resist and hard masks. Every other mention of "mask" herein refers specifically to optical masks, i.e., masks used by an optical lithography system to expose a pattern.) E-beam lithography systems are then used to write 254 patterns 250 such as line cuts and holes. An etch tool 276 is used to etch 278 the resist, exposing the features written 254 by the e-beam tool 230.

Generally, e-beam lithography systems can write with higher resolution than optical lithography systems. However, in e-beam lithography, features are generally written serially (by individual beams), one at a time, as opposed to lithographic printing of a much larger area with optical tools using masks.

FIGS. 2H and 2J show examples of prior art registration marks. These marks can also be used as alignment marks.

FIG. 2I shows an example of prior art alignment mark placement. Chip marks 280 are located within dies, while global marks 282 are located on the stage. Note that beam x-axis 284 and beam y-axis 286 are not necessarily parallel to (respectively) stage x-axis 288 and stage y-axis 290.

Wafer or substrate "alignment" is defined herein as the action of positioning a wafer or other substrate with respect to the coordinate system of a lithography, inspection, or other process tool. Marks on the wafer or substrate that facilitate this process are called "alignment marks".

"Pattern registration" (or "registration") is defined herein as positioning a subsequent pattern on the wafer or substrate with respect to a previous pattern on the wafer or substrate. Marks on the wafer or substrate that facilitate this process are called "registration marks". "Pattern overlay" is the measured error resulting from inaccuracy of the registration process.

Cross-like or other fiducial marks have historically been used to register and/or align a single column. FIG. 2H is an example of a previously used wafer alignment mark. FIG. 2I is an example of a previously used reticle alignment mark.

SUMMARY

The present application discloses new approaches to systems, devices and methods for writing and inspecting a substrate, using Hadamard targets to align the substrate with a coordinate system of the corresponding tool, and/or to register patterns to be written or inspected with previously written pattern layers.

In particular, the inventors have discovered that, in a charged particle beam column array context, beam alignment and registration performed using multiple Hadamard targets distributed across the surface of a substrate allows charged particle beam lithography and inspection tools to achieve superior resolution and accuracy in practice, improving yield rate.

The inventors have also discovered that Hadamard targets written small enough, and with a high enough order that at least some blocks can be effectively imaged at a default beam resolution while at least one block contains one or more features at or smaller than a threshold resolution (e.g., a resolution using default parameters, or a theoretical beam resolution limit for imaging), can be used to generate a variety of charged particle beam and beam column performance metrics usable for, e.g., extremely rapid calibration, column-to-column matching, and column life cycle management.

The inventors have also discovered that, by writing numerous (preferably Hadamard) targets to an edge-proximal portion of a substrate from which resist is typically removed prior to lithography, superior position and orientation information regarding pattern layers previously written to the substrate can be preserved, improving alignment and registration accuracy, as well as yield rate.

BRIEF DESCRIPTION OF THE DRAWINGS

The disclosed inventions will be described with reference to the accompanying drawings, which show important sample embodiments and which are incorporated in the specification hereof by reference, wherein:

FIG. 6A schematically shows an example of Hadamard targets distributed across a stripe.

DETAILED DESCRIPTION OF SAMPLE EMBODIMENTS

Figure 1:
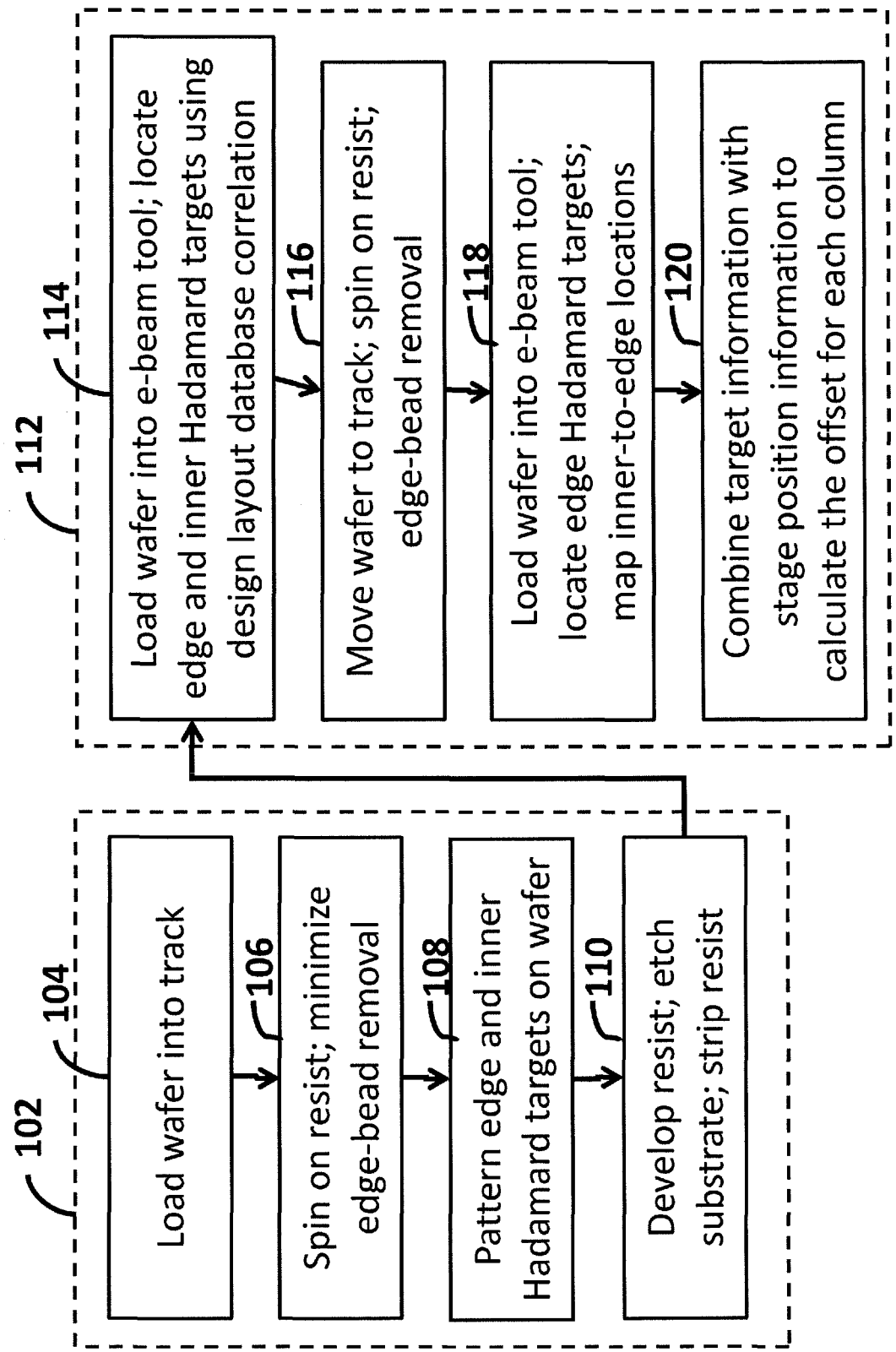
FIG. 1 shows an example process for wafer alignment.
Figure 2A:
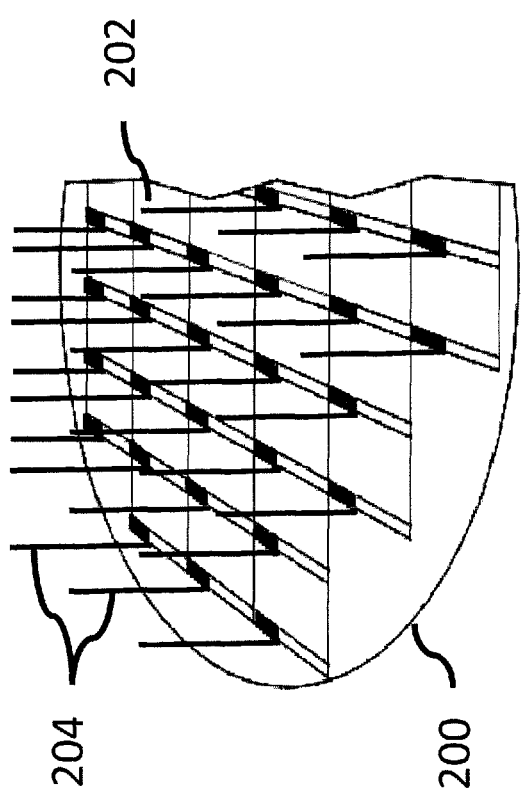
FIG. 2A shows an example of a wafer being scanned by multiple electron beams emitted by respective beam columns.
Figure 2B:
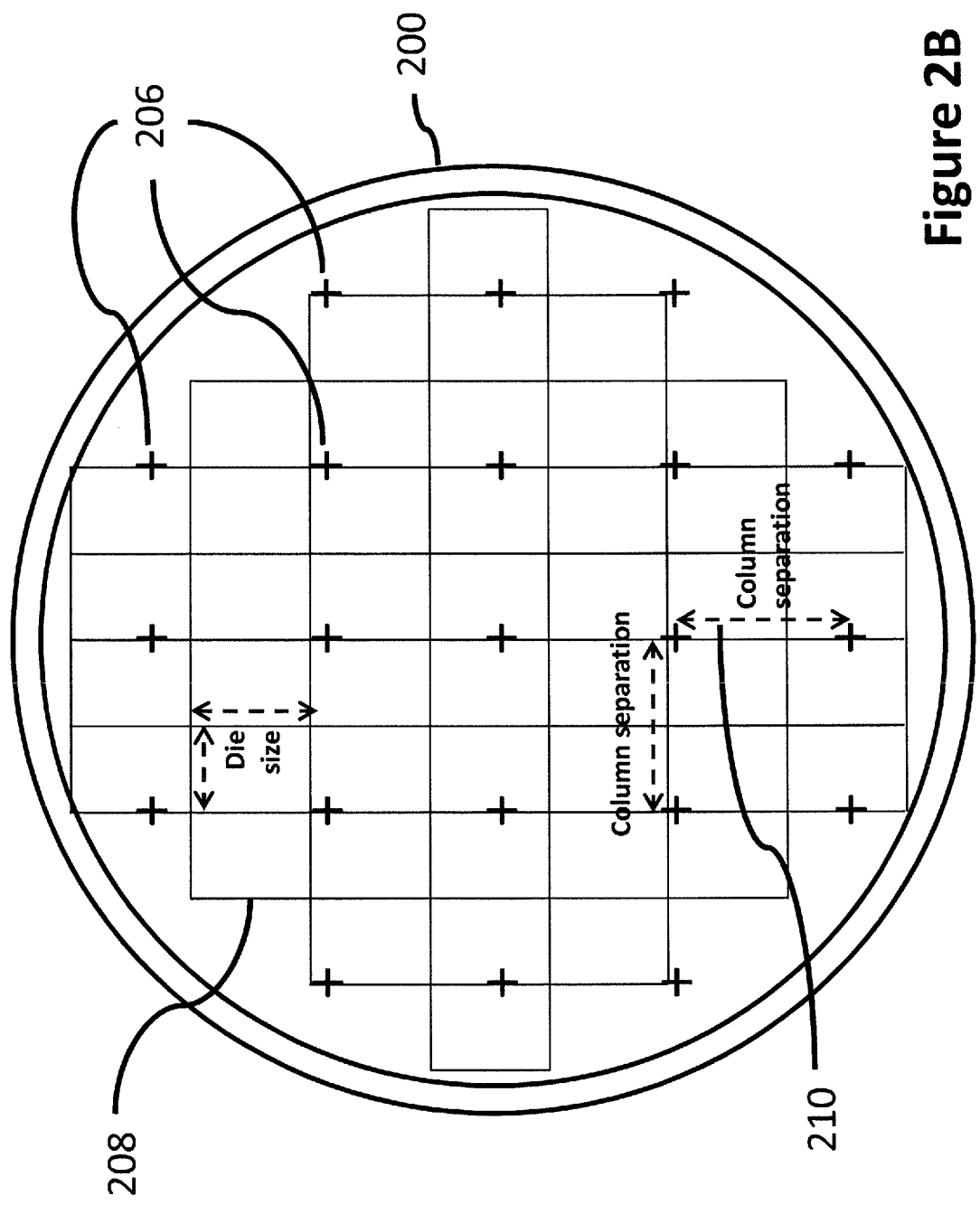
FIG. 2B shows an example of a wafer.
Figure 2C:
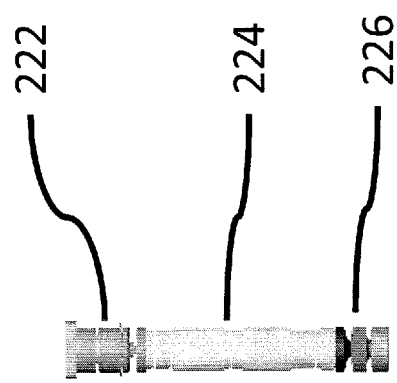
FIG. 2C schematically shows an example of a miniature e-beam column.
Figure 2D:
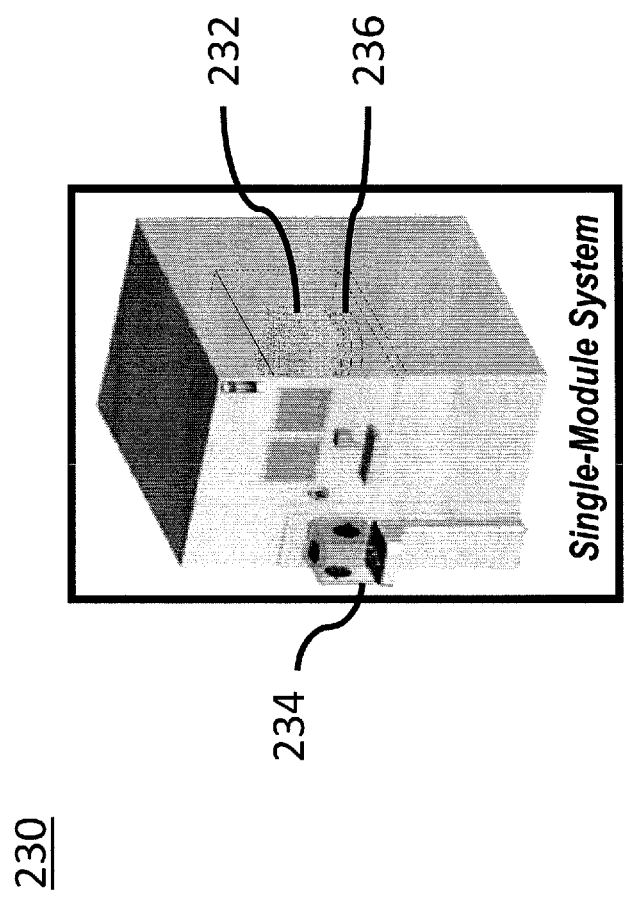
FIG. 2D schematically shows an example of a multi-column e-beam lithography or e-beam inspection system.
Figure 2E:
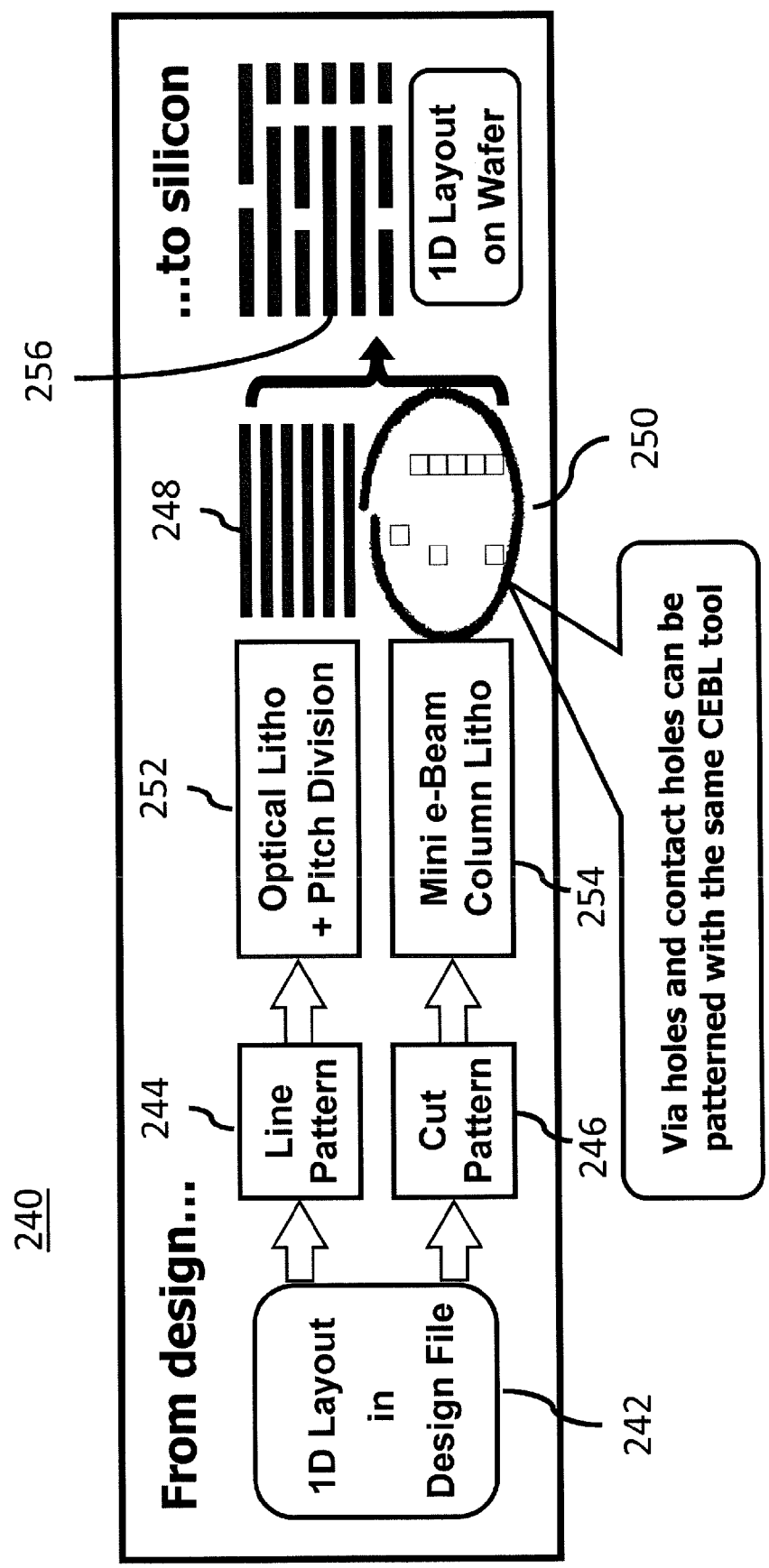
FIG. 2E shows an example of a 1-D layout process.
Figure 2F:
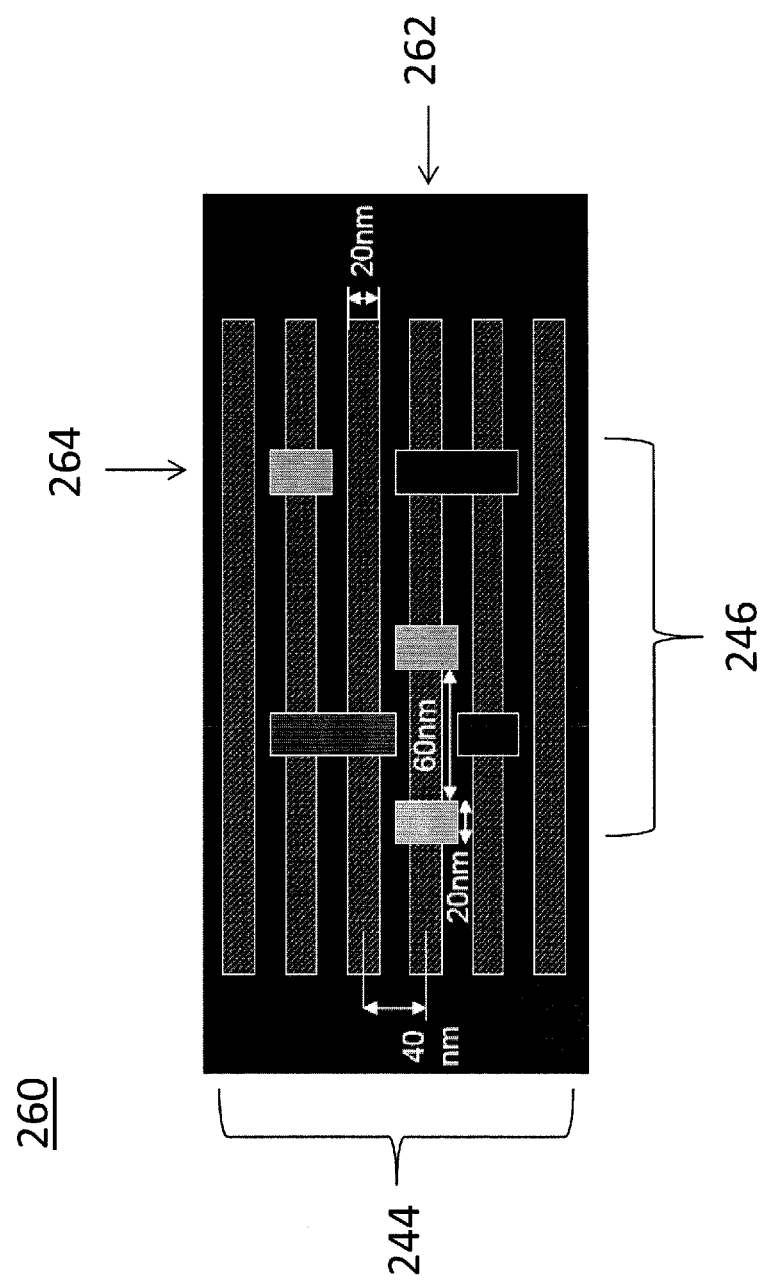
FIG. 2F schematically shows an example of a 1-D layout pattern.
Figure 2G:
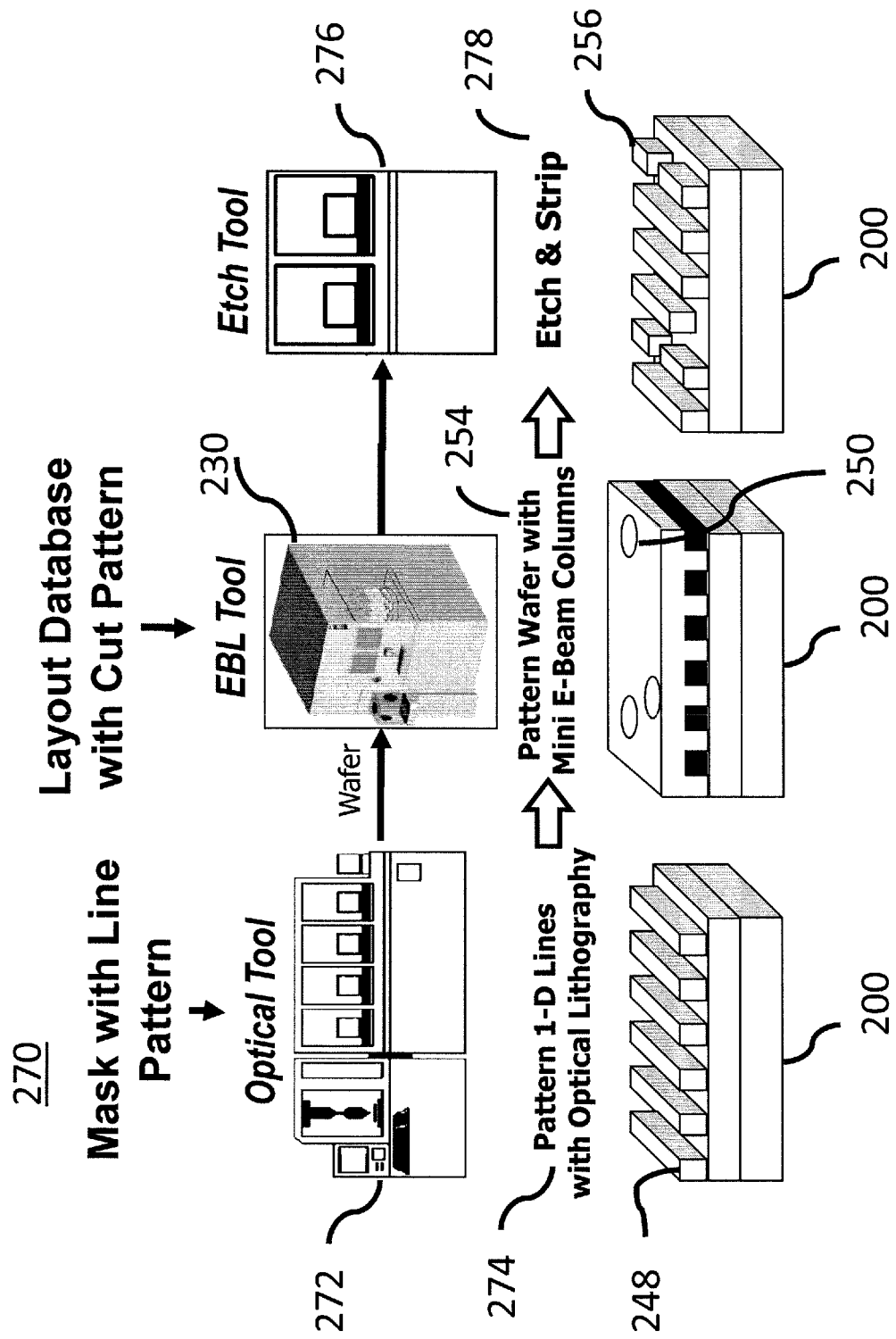
FIG. 2G shows an example of a complementary lithography process.
Figure 2H:
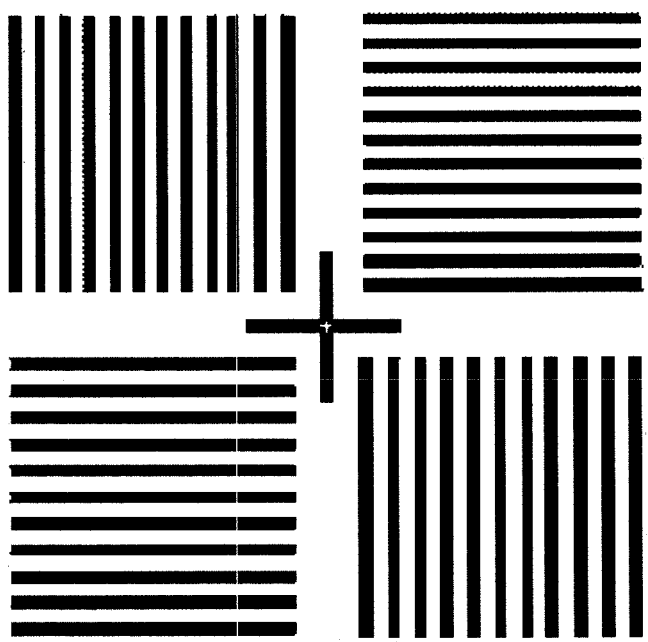
FIG. 2H shows an example of a prior art registration mark.
Figure 2I:
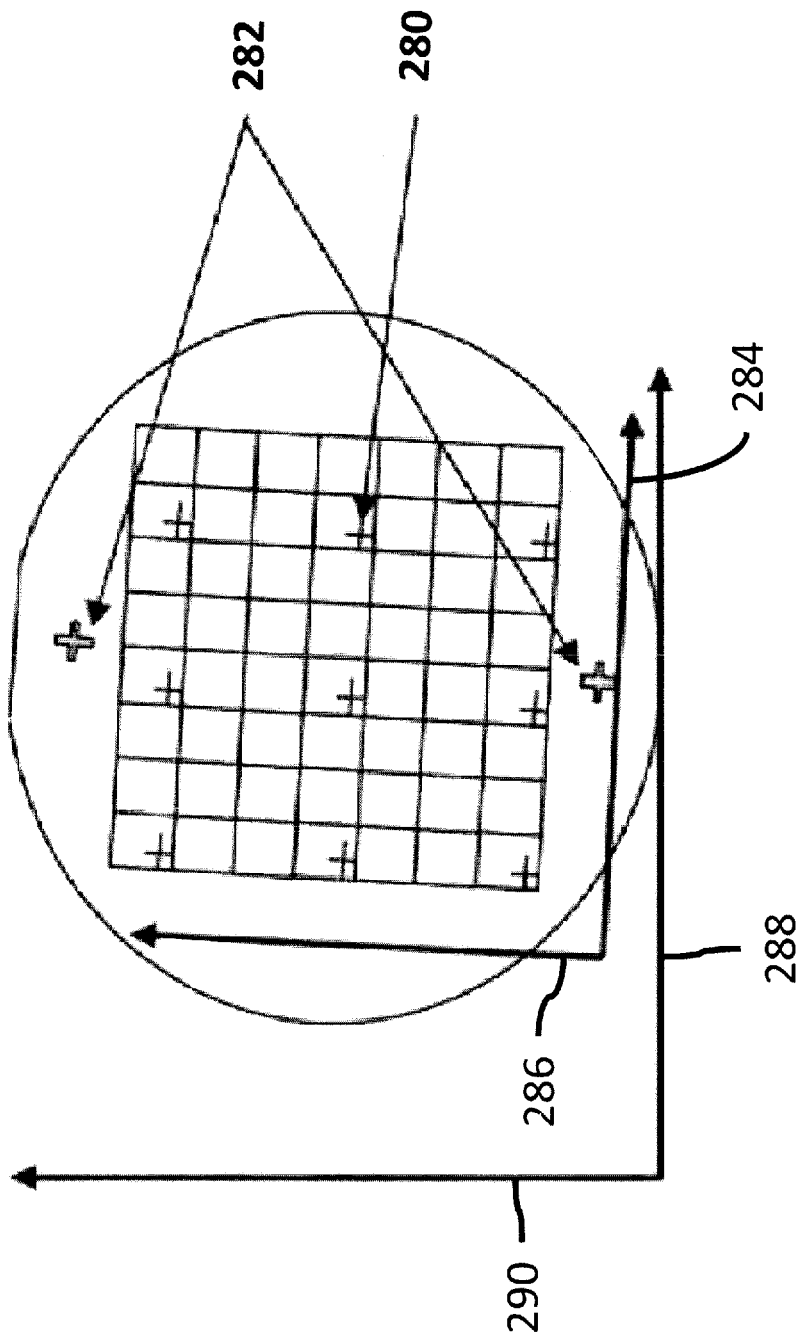
FIG. 2I shows an example of prior art alignment mark placement.
Figure 2J:
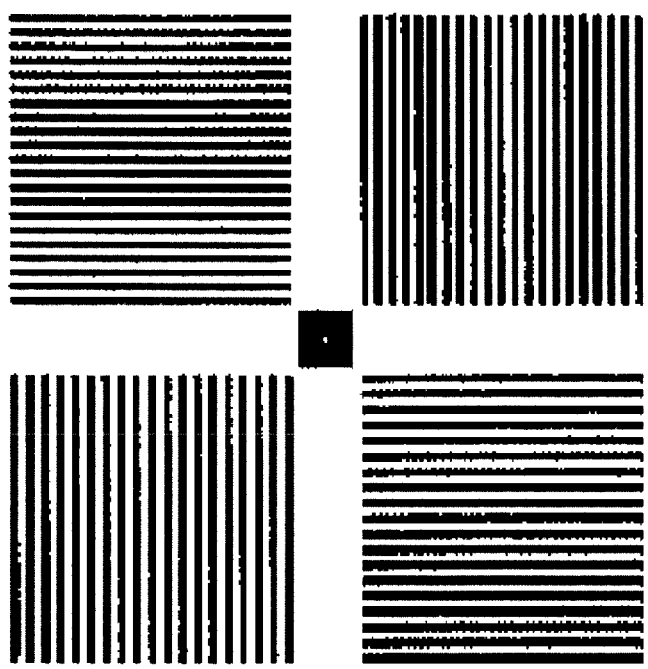
FIG. 2J shows an example of a prior art registration mark.

The numerous innovative teachings of the present application will be described with particular reference to presently preferred embodiments (by way of example, and not of limitation). The present application describes several inventions, and none of the statements below should be taken as limiting the claims generally.

The present application discloses new approaches to systems, devices and methods for writing and inspecting a substrate, using Hadamard targets to align the substrate with a coordinate system of the corresponding tool, and/or to register patterns to be written or inspected with previously written pattern layers.

In particular, the inventors have discovered that, in a charged particle beam column array context, beam alignment and registration performed using multiple Hadamard targets distributed across the surface of a substrate allows charged particle beam lithography and inspection tools to achieve superior resolution and accuracy in practice, improving yield rate.

The inventors have also discovered that Hadamard targets written small enough, and with a high enough order that at least some blocks can be effectively imaged at a default beam resolution while at least one block contains one or more features at or smaller than a threshold resolution (e.g., a resolution using default parameters, or a theoretical beam resolution limit for imaging), can be used to generate a variety of charged particle beam and beam column performance metrics usable for, e.g., extremely rapid calibration, column-to-column matching, and column life cycle management.

The inventors have also discovered that, by writing numerous (preferably Hadamard) targets to an edge-proximal portion of a substrate from which resist is typically removed prior to lithography, superior position and orientation information regarding pattern layers previously written to the substrate can be preserved, improving alignment and registration accuracy, as well as yield rate.

The disclosed innovations, in various embodiments, provide one or more of at least the following advantages. However, not all of these advantages result from every one of the innovations disclosed, and this list of advantages does not limit the various claimed inventions.

improved yield rate;
improved beam resolution and accuracy;
improved alignment and registration accuracy;
improved layer-to-layer metrology;
reduced pattern overlay error;
Hadamard targets provide improved beam drift mitigation and compensation;
Hadamard targets are easily configured for miniature electron beam column deflection field calibration (intra-column), and offset calibration and correction (inter-column);
per-column alignment and registration can be performed from imaging and identification of a single Hadamard target block;
Hadamard targets are selectable for high signal-to-noise ratio in a compact footprint;
Hadamard targets provide arbitrary target size and complexity scalability;
Hadamard targets provide arbitrarily complex security code options;
Hadamard targets provide superior target pattern fidelity;
Hadamard targets provide improved resilience of targets to optical-proximity and edge loading effects;
high-order Hadamard targets can be used to perform extremely rapid design of experiments (DOE) on beam parameters, and for various beam performance metrics.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

Multiple-column charged particle beam lithography and inspection offers increased throughput and circumvention of local charged particle dose limitations on semiconductor patterns, micro-electro-mechanical systems (MEMS), and other substrate-related device structures. Multiple-column technology requires substrate alignment and registration to properly place and orient new pattern layers with respect to underlying patterns while operating in a massively parallel, independent mode. Further, in high-throughput multiple-electron-beam systems, beam positioning drift problems can arise due to factors such as thermal distortion and fabrication errors of electron optics. Periodic recalibration using alignment and/or registration marks on the wafer can be used to achieve consistent beam placement accuracy and improve yield rate.

Embodiments disclosed herein enable superior alignment and registration using uniquely identifiable Hadamard patterns as registration and alignment targets. These targets can be scaled spatially and accessed temporally as required to meet demanding specifications for future generations of lithography and inspection. Disclosed embodiments also enable additional applications in the areas of lithography, inspection, and design optimization and in the areas of process control and yield improvement.

High-order Hadamard patterns can also be utilized to quickly obtain a variety of persistent and/or immediately actionable beam column performance metrics.

Generally, Hadamard target 402 patterns can be selected so that some or all blocks 302 comprising a Hadamard target 402 pattern comprise unique patterns with respect to each other (i.e., some or all of the individual blocks 302 in a Hadamard target 402 are different from each other block 302 in that Hadamard target).

Registration marks and alignment marks are collectively referred to herein as "targets" (where "target" is used as a noun). Those of ordinary skill in the art of charged particle beam lithography will understand from context where "target" is used as a verb, in which case it refers to direction (using, e.g., electrostatic deflection) of charged particle beams to particular locations on a substrate surface.

All embodiments of the invention use arrays of charged particle beam columns. Preferred embodiments use electrostatically controlled e-beam mini-columns. In some embodiments, these columns can be configured to write with charged particle beams on substrates and/or (either or both) image features on substrates.

Image capture (imaging) can be performed in various ways, e.g., in the manner of a scanning electron microscope (SEM), or using a combination of vector and raster scanning. Captured images of registration marks can be used for, for example, alignment of columns, registration with other patterns on the substrate, overlay with previously formed patterns, measurement of critical dimensions, and characterization of defects. This technology also applies to multi-column arrays for the purposes of mitigating beam drift, improving beam placement accuracy, enhancing overlay accuracy, and increasing overall lithographic and process yield.

Hadamard and Walsh transforms are examples of a class of generalized Fourier transforms. They return values of −1 and +1, interpretable as binary 0's and 1's (write a pixel and do-not-write a pixel) for purposes of the inventions herein.

Figure 3:
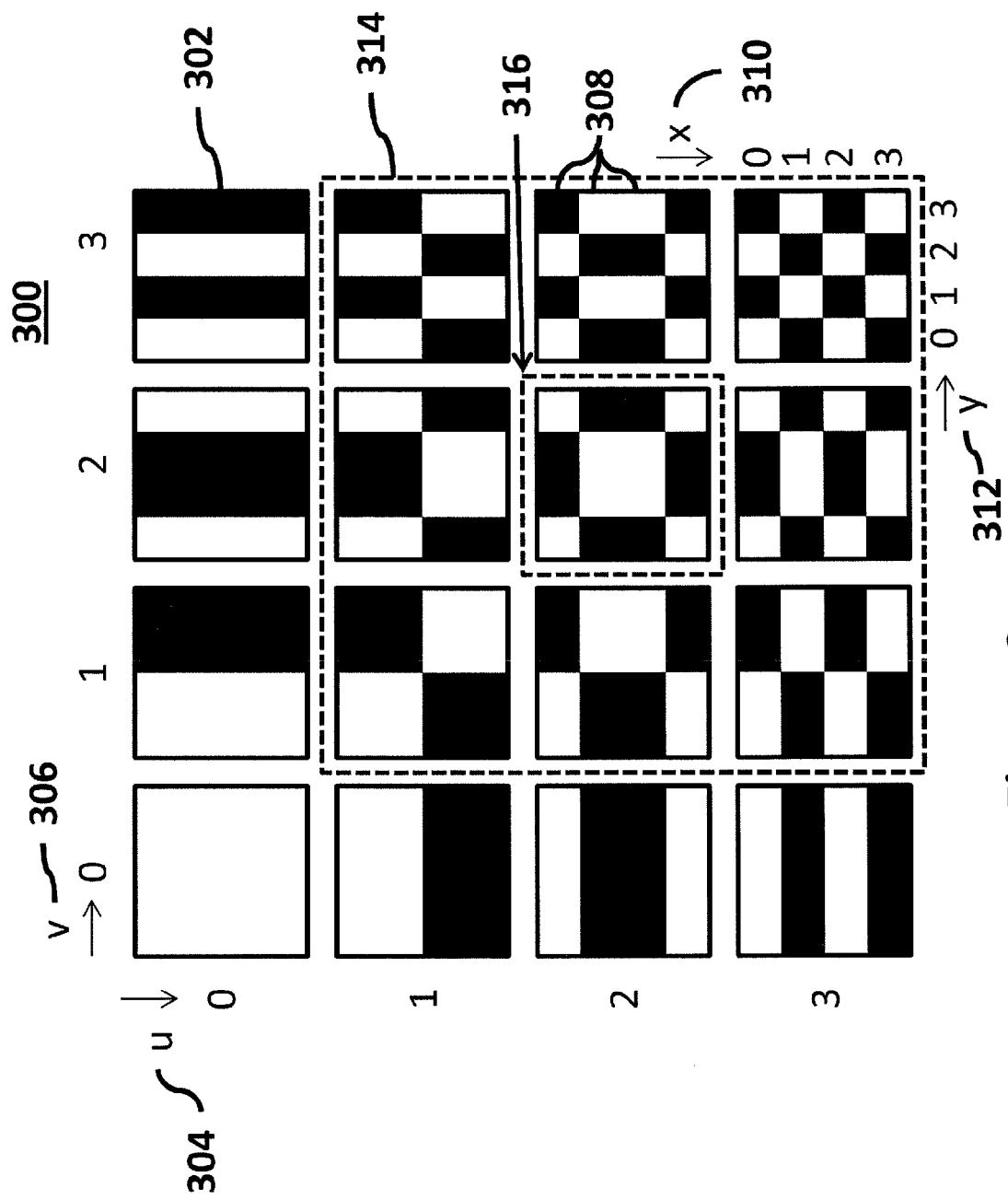
FIG. 3 schematically shows an example of a Hadamard pattern generated using the Hadamard transform.

A "Hadamard matrix", as used herein, is the matrix of outputs of the functions or algorithms used to generate a Hadamard target 402; see, e.g., FIG. 3. The "transform output vectors", as used herein, are either the individual rows or the individual columns of entries in a Hadamard matrix, but not both with respect to permutations performed to generate a single Hadamard target pattern. "Block" 302 and "sub-block" 308 are defined below. The "binary correlation" between a pair of blocks 302 in a Hadamard target 402 is defined as the sum of the products of the ±1 values in sub-blocks 308 (cells) in the same (row, column) location (having the same x 310 and y 312 indices) in pairs of different blocks 302 in a Hadamard target 402. "X and y edge information" refers herein to edge information corresponding to edges running in x and y directions, i.e., generally orthogonal directions on the surface of a substrate.

A "Hadamard target" 402 is defined herein as a pattern generated using functions or algorithms used to calculate the Hadamard and/or Walsh transform(s) (e.g., as shown in Equation 1 below); wherein transform output vector reordering (per-vector reordering, not within vectors) is permitted; wherein the N rows and columns that would have the fewest sign changes (write/do-not-write transitions) after sequency reordering of the Hadamard matrix can be removed; wherein additional permutations are then permitted if they preserve edges (write/do-not-write transitions) corresponding to adjacent sub-blocks within a block; and wherein transposition of entire blocks is then permitted, as discussed below with respect to FIG. 3. (Sequency ordering arranges the transform output vectors in order of the number of sign changes per vector.) Unmodified Hadamard transform outputs have a large amount of x and y edge information and block-to-block pattern uniqueness. Those of ordinary skill in the art of lithographic patterning and inspection using charged particle beams will understand that such reordering and permutation should be chosen to retain sufficient x and y edge information and block-to-block pattern uniqueness to enhance signal-to-noise ratio and enable rapid determination of which block 302 is being imaged during inspection. Preferably, the binary correlation between pairs of blocks 302 in a Hadamard target 402 should be 0 to enhance block-to-block pattern uniqueness.

For example, the Hadamard pattern 300 shown in FIG. 3 corresponds to a sequency-ordered Hadamard matrix of size 16×16. A Hadamard target 402 can advantageously be selected as the pattern shown in FIG. 3 other than the portions indexed by u=0 or v=0 (i.e., 3×3 Hadamard array 314).

A mathematical description of Hadamard targets 402 is given below in Equations 1 and 2 for the case of N=4, wherein blocks 302 have indices u and v with values from 0 to N−1, and sub-blocks 308 have indices x and y with values from 0 to N−1, as shown in FIG. 3. This is a special case; N can be (generally) any positive integer, though preferably N≥4. As used herein (for u 304, v 306, x 310 and y 312 as described below with respect to FIG. 3), a "block" 302 is the portion of a Hadamard target 402 indexed by a single (u,v) pair; and a "sub-block" 308 is a single cell, corresponding to a single row and a single column in the Hadamard target 402 (indexed by the quadruplet (u,v,x,y) in FIG. 3). (The indices u, v, x, and y correspond to the indices u 304, v 306, x 310 and y 312 with respect to an unpermuted Hadamard matrix generated using Equations 1 and 2.)

$$H(u, v) = \frac{1}{4}\sum_{x=0}^{3}\sum_{y=0}^{3} f(x, y)(-1)^{\sum_{i=0}^{1} [b_i(x)p_i(u)+b_i(y)p_i(v)]}$$ (Equation 1)

$$f(x, y) = \frac{1}{4}\sum_{u=0}^{3}\sum_{v=0}^{3} H(u, v)(-1)^{\sum_{i=0}^{1} [b_i(x)p_i(u)+b_i(y)p_i(v)]}$$ (Equation 2)

The variables and constants in Equations 1 and 2 above are defined as follows:
Indices u, v, x, and y run from 0 to 3 (0 to N−1)
$p0(u)=b1(u)$
$p1(u)=b1(u)+b0(u)$
$p0(v)=b1(v)$
$p1(v)=b1(v)+b0(v)$
$b0(x)$ is the $0^{th}$ bit in the binary representation of x
$b1(x)$ is the $1^{st}$ bit in the binary representation of x
Generalized equations for the Walsh-Hadamard transform are set forth in, for example, the Gonzalez and Woods "Digital Image Processing" reference, fully cited below and incorporated herein by reference.

Hadamard and/or Walsh transform(s) are used as generating functions to create Hadamard target patterns and reference patterns for Hadamard targets already written to a substrate.

Hadamard (and/or Walsh) matrices used to create Hadamard targets are computable using the generating functions (e.g., Equations 1 and 2) and are, therefore, easily integrated with a "cutting" database supplied to the lithography or inspection tool. Noisy reference images are unnecessary.

Preferred embodiments use a plurality of Hadamard targets 402 to meet anticipated next-generation alignment and pattern registration requirements for both inspection and lithography. In semiconductor wafer inspection, precise location of defect position is critical for root-cause analysis and yield estimation. In semiconductor lithography, precise location of successive patterns is critical to the formation of functional circuits.

Other registration marks, such as checkerboard patterns, grating patterns, box-in-box patterns, bar-in-bar patterns, and other registration (and alignment) marks can also be used in addition to Hadamard targets 402 and/or as edge-proximal targets.

Once targets are imaged, a pattern recognition algorithm measuring, e.g., the amount of correlation between (1) the captured image and (2) a template comprising a computer-generated template (used in preferred embodiments; this can be pre-computed) or a stored image, is used to recognize imaged target pattern(s). Pattern recognition algorithms typically generate a mathematical "correlation score" to quantify the goodness of the match between the captured image and the template. When imaging Hadamard targets 402, beam columns 206 preferably image at least sufficient x and y edge information to distinguish the resulting signal from random noise in the captured image.

Imaging and analysis for pattern recognition of Hadamard target 402 features by multi-column e-beam tools can be made automatic using, for example, substantially the same beam columns and stages, and the same design layout database, for writing and imaging said Hadamard targets 402, as disclosed in U.S. patent application Ser. No. 14/198, 145 (definitions of "substantially the same" beam columns and "substantially the same" stages as provided therein are adopted herein), which is incorporated herein by reference.

"Offsets" are defined herein as adjustments made to parameters used to target e-beam columns 206 to locations specified by the design layout database so that actual locations where the beam intersects the substrate match (preferably, as closely as possible) actual locations where pattern should be written (for lithography, e.g., to properly correspond to pattern locations in previously-written layers) or has been written (for inspection). It will be apparent to one of ordinary skill in the arts of charged particle beam lithography and inspection that statements and claim language herein referring to offsets with respect to beams rather than columns are shorthand references to offsets applied to parameters used to target corresponding columns projecting the beams being discussed or claimed.

FIG. 1 shows an example process for wafer alignment. In preferred embodiments, targets are prepared for use in wafer alignment (or registration) 102 as follows. After a wafer 200 is loaded into the track 104, resist is spun on. Edge-bead removal following resist spin-on is minimized 106 in order to leave sufficient resist in an edge-proximal portion of the wafer 200 to allow that edge-proximal portion to be written with pattern.

After the wafer 200 is prepared with resist, an e-beam array patterns the wafer 200 with edge Hadamard targets 406 and inner Hadamard targets 404 in step 108. "Edge targets" are defined herein as alignment and/or registration marks (Hadamard targets 402 and/or other patterns) patterned on edge-proximal portions of the wafer 200 from which most or all resist will be removed following resist spin-on when preparing to write later pattern layers. "Inner targets" are defined herein as targets (Hadamard targets 402 and/or other patterns) patterned on non-edge-proximal portions of the wafer 200 (e.g., portions of the wafer 200 that will comprise dies 208 or that will be between die regions when the wafer 200 is cut) that will remain covered by sufficient resist for pattern writing (generally, will be buried under resist) following edge-bead removal after resist spin-on when preparing to write later pattern layers (e.g., following step 116). Edge targets are alignment and/or registration marks that are exposed and available for imaging for alignment and/or registration during later EBL pattern layer write iterations. After edge and inner Hadamard targets 404, 406 are written 108, the resist is developed, the substrate is etched, and the resist is stripped 110, leaving behind the written pattern (including the written edge and inner Hadamard targets 404, 406).

Once the targets are prepared 102, they can be used for wafer alignment and/or pattern registration.

In preferred embodiments, wafer alignment 112 for substrate lithography and/or inspection is performed as follows. A wafer 200 with multiple Hadamard targets 402 previously prepared 102 is loaded into an e-beam tool. (Herein, a wafer 200 with multiple Hadamard targets 402 previously prepared 102 refers to a wafer 200 with Hadamard targets 402 located in multiple different writing areas, i.e., of multiple different columns 206 in an array of columns 206.) The e-beam tool then images the wafer 200 (e.g., at and/or near expected Hadamard target locations based on the design layout database) and locates edge and inner Hadamard targets 404, 406 using design layout database correlation 114 (using pattern recognition, such as the "correlation score" described above).

The locations of the Hadamard targets 402 detected in step 114 (corresponding to deflections of the e-beams by the respective emitting columns when imaging the Hadamard targets 402, and contemporaneous stage positions) are stored for use in later steps. The wafer 200 is then moved to the track, resist is spun-on, and edge-bead removal is performed to leave the edge-proximal portion of the wafer 200 on which the edge Hadamard targets 406 were written bare of resist 116 (e.g., using standard edge-bead removal techniques). The wafer 200 is then loaded into an e-beam tool (a combined EBL/EBI tool or an EBI tool). The EBI (imaging) functions of the e-beam tool are used to locate the edge Hadamard targets 406, and the resulting edge Hadamard target locations are mapped to the previously-written inner Hadamard target locations 118 using the locations determined by the imaging of step 114 (which indicate the relative spatial positions of edge and inner Hadamard targets 404, 406). Target location information and stage position information, from steps 114 and 118, are combined to calculate offsets for the columns 206 in step 120 (e.g., by comparing target locations as-written to target locations specified in the design layout database; stage-related distortions are addressed with respect to, e.g., FIG. 11). Edge Hadamard targets 406, carrying over between (resist spin-on and) writing iterations corresponding to successive pattern layers, thus allow highly accurate e-beam column alignment and registration, enabling reduced pattern overlay error and increased yield rate.

Steps 118 and 120 can be repeated to perform alignment for later substrate lithography and inspection iterations.

FIG. 3 schematically shows an example of a Hadamard pattern 300 generated using the Hadamard transform. This Hadamard pattern 300 corresponds to a sequency-ordered Hadamard matrix generated using the Hadamard transform pair provided above as Equations 1 and 2 (N=4). The rearranged 4×4 array 300 of blocks 302 has indices u 304 and v 306, and embedded sub-blocks 308 with indices x 310 and y 312.

Generally, the most useful patterns for alignment and/or registration are those that provide two-dimensional edge information (both x AND y directions). Hadamard patterns are easily selectable for maximum x and y edge information (corresponding to edges running in x and y directions) to increase the signal-to-noise ratio of position estimates. The Hadamard pattern 300 shown in FIG. 3 includes a 3×3 Hadamard array 314 (a 3×3 array of blocks 302 generated using the Hadamard transform) that provides a large amount of edge information in both x and y directions, and is preferred for use as a Hadamard target 402 for wafer alignment and/or pattern registration.

Hadamard target patterns can be selected so that a single Hadamard target block 302 provides sufficient x and y edge information, when that block 302 is imaged, to locate the Hadamard target's 402 center block 316 (and/or other blocks 302, for further imaging); and/or to perform effective registration and/or alignment; and/or to locate the Hadamard target 402 with respect to other Hadamard targets 402 on the wafer 200. Imaging additional Hadamard target blocks 302, and particularly a symmetric Hadamard target block 302 at or near the center of a Hadamard target 402 such as a center block 316, can further improve the signal-to-noise ratio of position estimates.

Hadamard targets 402 are easily configured as rearrangements (transpositions) of their component blocks 302, generally without compromising their utility as alignment and/or registration targets. For example, a Hadamard target 402 comprising a 3×3 Hadamard array 314, with nine (9) blocks 302, can have those blocks 302 rearranged in up to nine factorial (9!), or 362,880, different ways. (Hadamard targets 402 with larger numbers of blocks 302 can potentially have those blocks 302 rearranged in even more ways.) This provides a large number of unique block combinations to be used as, for example, identification or security codes, indexable by, for example, a look-up table. These codes can be used, for example, to mark a product line, an individual wafer, a wafer location, or an individual die, or to encode data (individually or as a group of coded targets).

The Hadamard pattern 300 shown in FIG. 3 is produced using N=4, but a wide range of values of N are potentially useful. For example, higher N can be used to produce Hadamard targets 402 with increased and/or more densely compressed x and y edge information.

Figure 4:
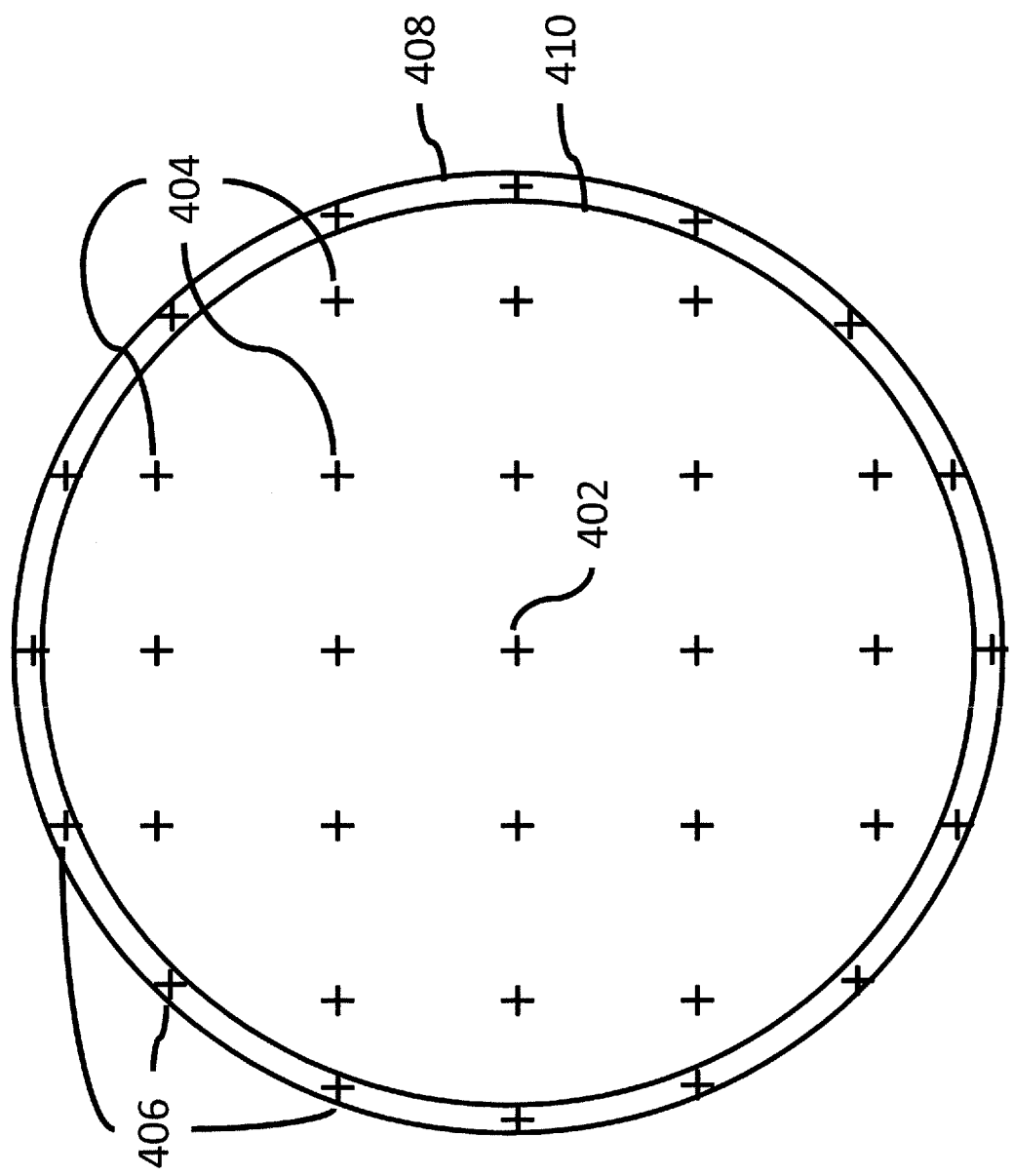
FIG. 4 schematically shows an example of a wafer with Hadamard targets distributed across its surface.

FIG. 4 schematically shows an example of a wafer 200 with Hadamard targets 402 distributed across its surface. FIG. 4 shows example placement of both edge and inner Hadamard targets 404, 406. Hadamard targets 402 can be written on the substrate at spacing corresponding to the column separation 210, or with other regular or irregular spacing, and/or more densely, as shown below in FIGS. 5, 6A, 6B, 7A and 7B.

In preferred embodiments, Hadamard targets 402 are constructed such that each block 302 has a known spatial vector separating it from the central block 316. Generally, imaging and locating one block 302 in a 3×3 block array 314 Hadamard target 402 is sufficient for accurately determining the location of the center (or central block 316) of the Hadamard target 402. (Imaging and locating a block 302 can comprise imaging portions of one or more blocks 302 until the boundaries of an individual block 302 are determined.) Furthermore, each Hadamard target 402—including inner Hadamard targets 404 and edge Hadamard targets 406—is separated by a known (or calculable based on the design layout database) spatial vector from the center of the other Hadamard targets 402 on a substrate, as well as from the center of the substrate 408, and potentially from the edge of the substrate 410. The outer edge of the resist layer 412 that remains after typical edge-bead removal (leaving the edge-proximal region of the substrate bearing edge targets 406 bare) can be considered a boundary between inner Hadamard targets 404 and edge Hadamard targets 406.

Hadamard targets 402 are easily configured for multi-column offset calibration and correction (inter-column): multiple columns 206 can be used to scan the same Hadamard target 402 for column-to-column positional correlation. This can be facilitated by placing one or more Hadamard targets 402 near junctions between column writing areas, enabling easy access and imaging by adjacent columns 206.

Figure 5:
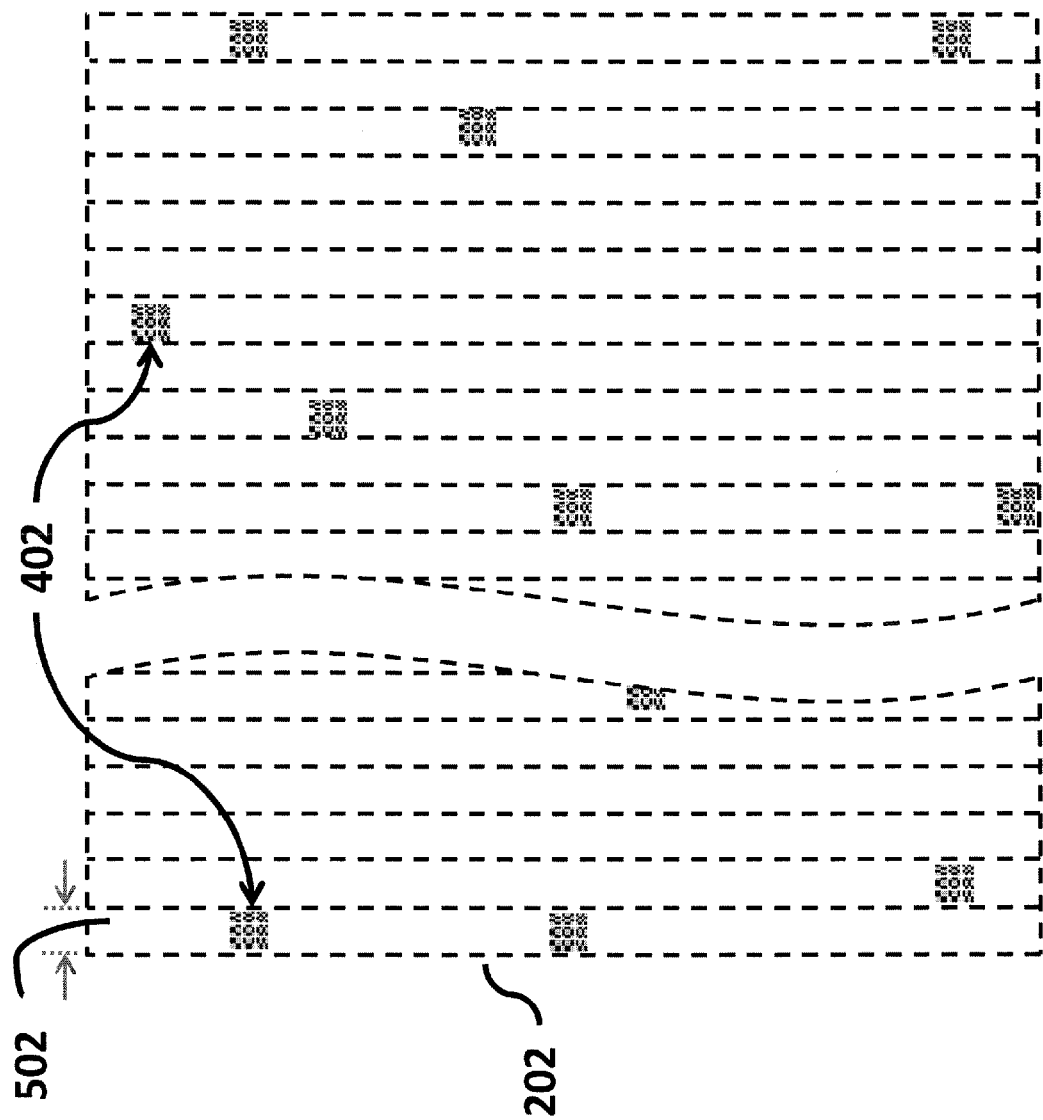
FIG. 5 schematically shows an example of Hadamard targets distributed across a writing area comprising multiple stripes.

FIG. 5 schematically shows an example of Hadamard targets 402 distributed across a writing area 202 comprising multiple stripes 502. A stripe 502 is the portion of the wafer 200 surface that an e-beam can target while the stage is moving predominantly in a single direction, i.e., before the stage moves laterally and switches predominant directions to give the e-beam access to a different stripe 502. Multiple Hadamard targets 402 can be located within a column's 206 writing area 202 (across the scan field). Distribution of Hadamard targets 402 across the column writing area 202 allows registration on the fly—that is, e-beams can visit nearby Hadamard targets 402 when convenient (e.g., when a Hadamard target 402 is within the current scan field 604) during a writing and/or imaging iteration in order to refine, repair or confirm accurate pattern registration. Generally, the more Hadamard targets 402 are distributed through a writing area 202, the more readily and/or frequently registration or re-registration (or other procedures disclosed herein with respect to Hadamard targets 402) can be performed.

FIG. 6A schematically shows an example of Hadamard targets 402 distributed across a stripe 502. Columns 206 can write patterns and/or inspect regions within a writing area 202 comprising multiple stripes 502; stripes comprise multiple frames 602. A frame 602 is the portion of the wafer surface that an e-beam can target at a given time.

Figure 6B:
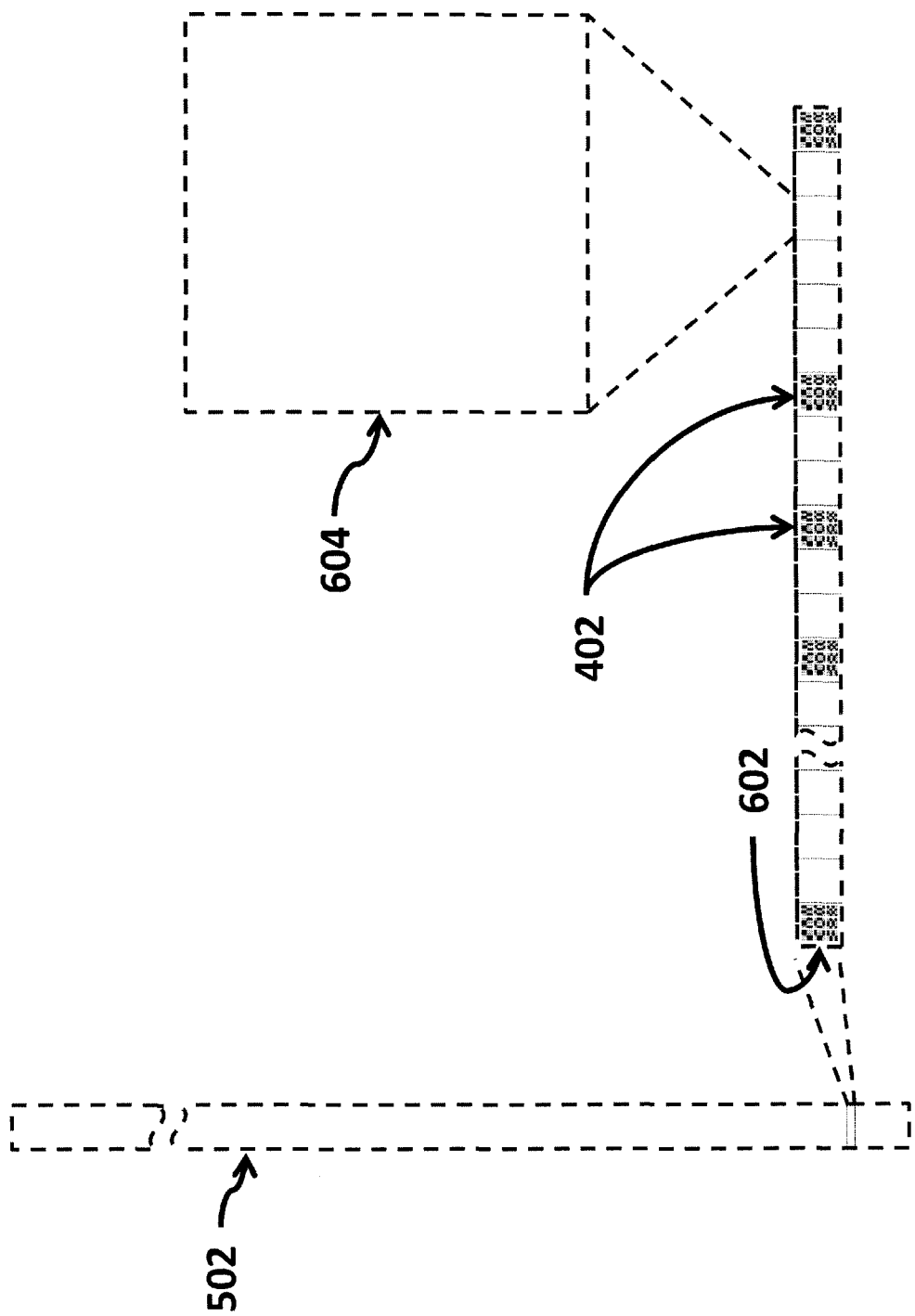
FIG. 6B schematically shows an example of Hadamard targets distributed across a frame comprising multiple scan fields.

FIG. 6B schematically shows an example of Hadamard targets 402 distributed across a frame 602 comprising multiple scan fields 604. A scan field 604 is a portion of a frame, used for addressing purposes.

Figure 7A:
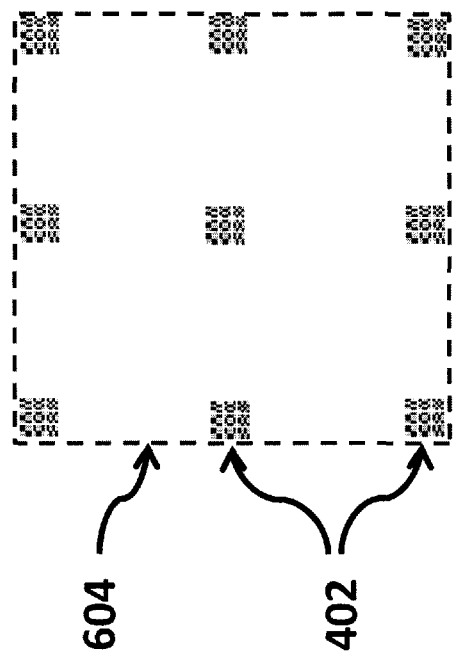
FIG. 7A schematically shows an example of Hadamard targets distributed across an e-beam scan field.
Figure 7B:
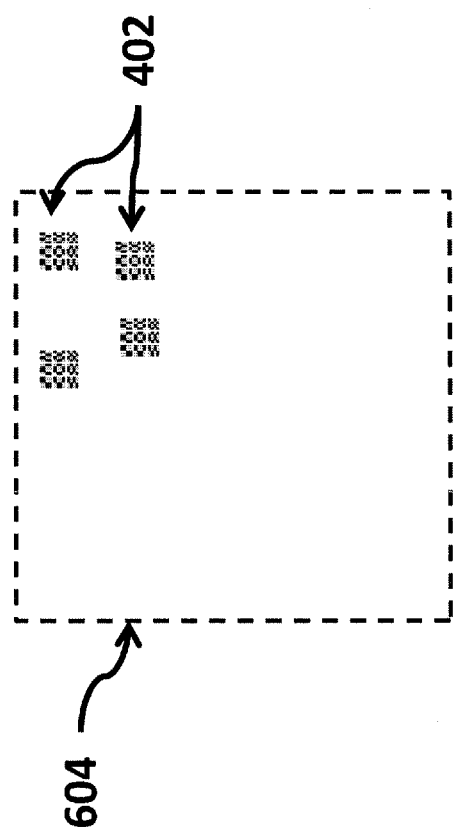
FIG. 7B schematically shows an example of Hadamard targets distributed across an e-beam scan field.

FIGS. 7A and 7B schematically show examples of Hadamard targets 402 distributed across an e-beam scan field 604. Hadamard targets 402 can be regularly spaced within a scan field 604 as shown in FIG. 7A, or can be irregularly scattered across a scan field 604 as shown in FIG. 7B (the latter would more likely be typical in a production wafer).

Hadamard targets 402 are easily configured for mini-column deflection field calibration and correction (intra-column). Deflection field calibration (imaging Hadamard targets and calculating offsets based on comparison between imaged targets and the design layout database) can performed using Hadamard targets 402 distributed across frames 602 and across scan fields 604.

Figures 8A, 8B:
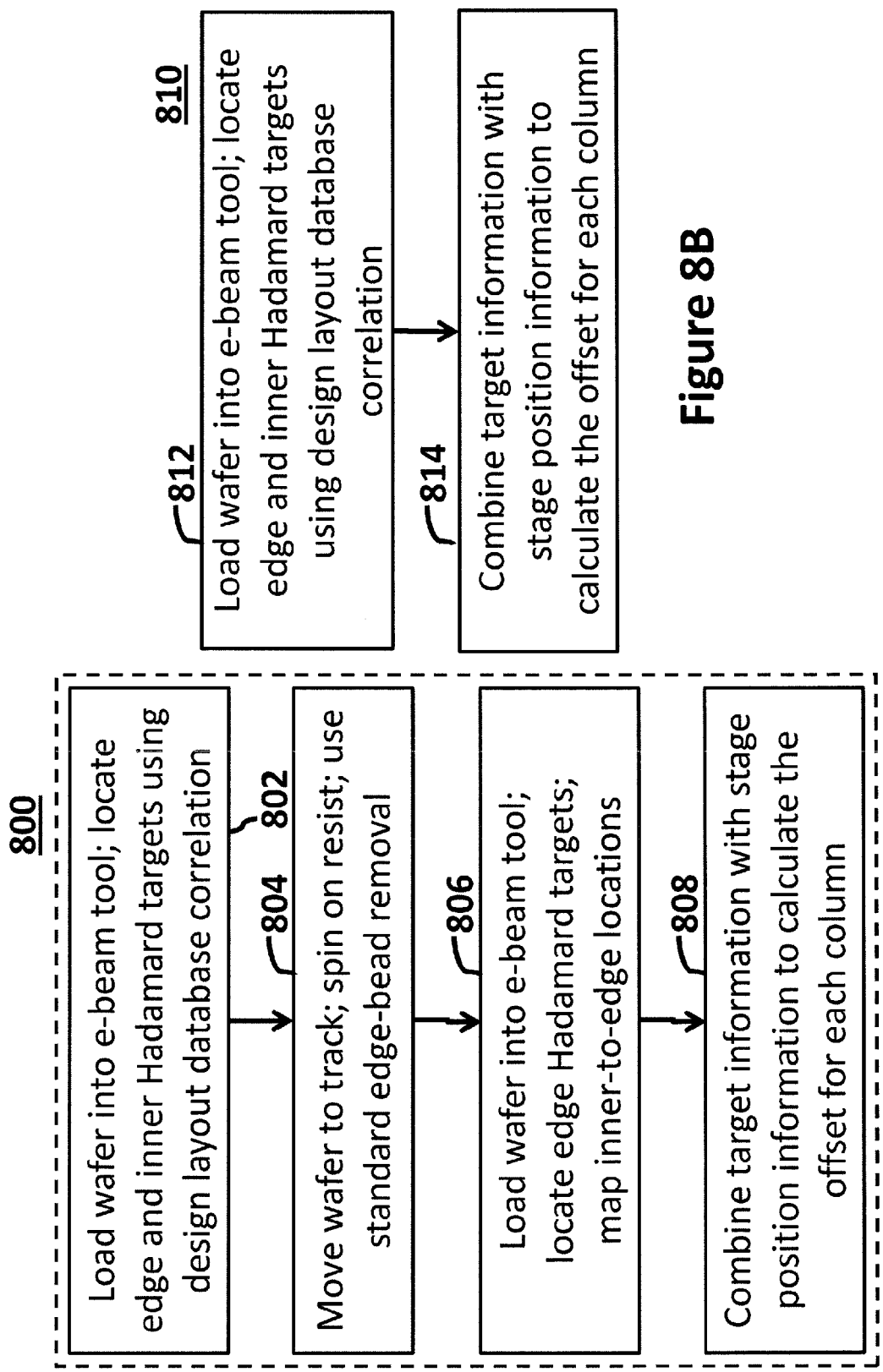
FIG. 8A shows an example process for aligning multiple e-beam columns for substrate lithography.
FIG. 8B shows an example process for aligning multiple e-beam columns for substrate inspection.

FIG. 8A shows an example process for aligning multiple e-beam columns 206 for substrate lithography 800. A wafer 200 with Hadamard targets 402 previously prepared 102 is loaded into an e-beam tool. The e-beam tool then locates the edge and inner Hadamard targets 404, 406 using design layout database correlation 802. The locations of the Hadamard targets 402 detected in step 802 are stored for use in later steps. The wafer 200 is then moved to the track, resist is spun-on, and edge-bead removal is performed to leave the edge-proximal portion of the wafer 200 on which the edge Hadamard targets 406 were written bare of resist 804. The wafer 200 is then loaded into an e-beam tool (a combined EBL/EBI tool or an EBI tool). The EBI (imaging) functions of the e-beam tool are used to locate the edge Hadamard targets 406, and the resulting edge Hadamard target locations are mapped to the previously-written inner Hadamard target locations 806 using the locations determined by the imaging of step 802 (which indicate the relative spatial positions of edge and inner Hadamard targets 404, 406). Target location information and stage position information, from steps 802 and 806, are combined to calculate offsets for the columns 206 in step 808.

FIG. 8B shows an example process for aligning multiple e-beam columns 206 for substrate inspection 810. A wafer 200 with Hadamard targets 402 previously prepared 102 is loaded into an e-beam tool. The e-beam tool then locates the edge and inner Hadamard targets 404, 406 using design layout database correlation 812. Target location information and stage position information are combined to calculate offsets for the columns 206 in step 814.

Figure 9:
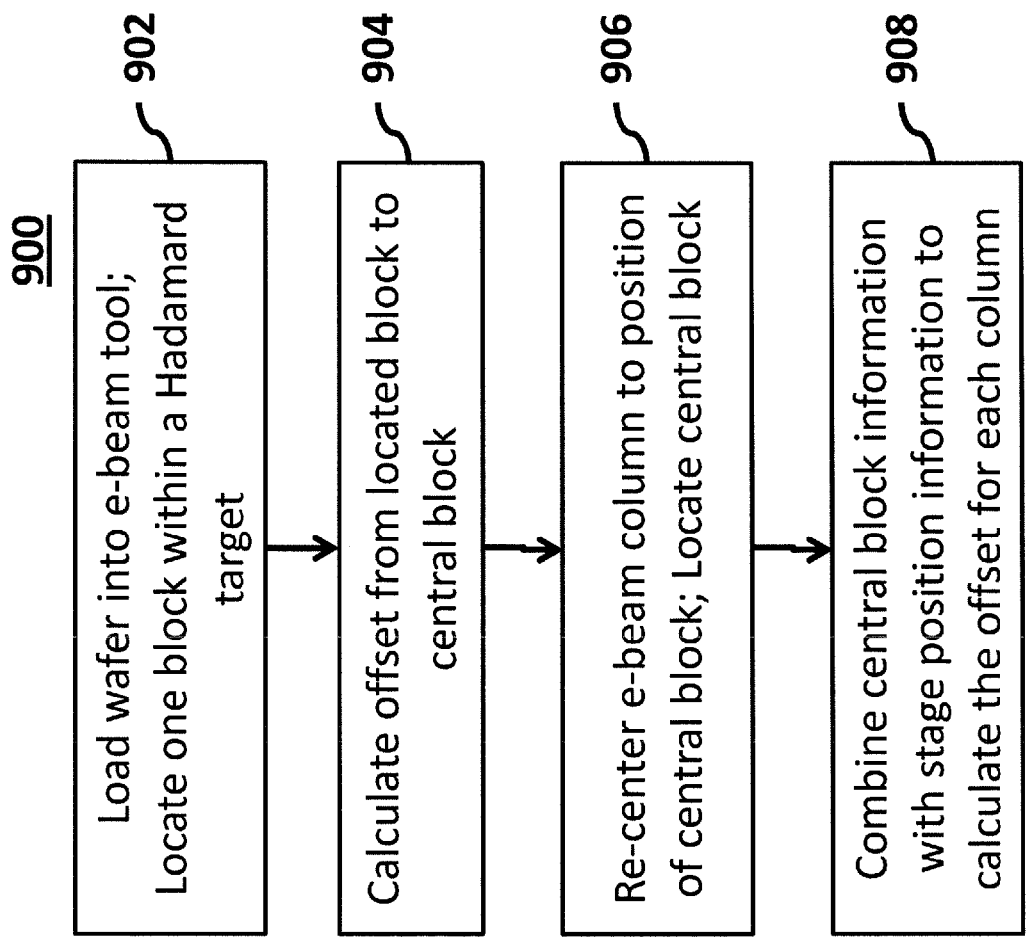
FIG. 9 shows an example process for substrate alignment.

FIG. 9 shows an example process for substrate alignment 900. Alignment and registration can be performed using multiple Hadamard blocks 302 in one or more Hadamard targets 402, the blocks 302 having known offsets to respective Hadamard target central (or most-symmetric) blocks 316, to increase alignment robustness and to reduce alignment overhead. For example, if there is a "near-miss" when an e-beam beam is vectored to (or otherwise deflected to target) a specific block 302 in a Hadamard target 402 to image that block 302, then imaging can be directed to locate a unique pattern in the Hadamard target 402. The actual location of the unique pattern, as imaged, allows the discrepancy between deflection parameters used for targeting, and deflection parameters required to image the intended target, to be determined. The corresponding e-beam column can then be controlled to either correct position immediately or re-center and re-align based on design layout database information (e.g., using some or all of the Hadamard target portion actually imaged, and/or by completing imaging of the block 302 actually vectored to and/or of the block 302 containing the located unique pattern).

In some embodiments, as shown in FIG. 9, a wafer 200 with Hadamard targets 402 previously prepared 102 is loaded into an e-beam tool. Ones of the e-beam columns 206 in the e-beam tool then locate a Hadamard target block 302 within a Hadamard target 402 in step 902; for example, by targeting a central (or most-symmetric) block 316 of a Hadamard target 402. The offset from the imaged block 302 to the central block 316 of that Hadamard target 402 is then calculated 904 using the known spatial vector between the two blocks 302. Using the calculated offset, the beam emitted by the e-beam column 206 is re-centered to target the central block 316 of that Hadamard target 402. That central block 316 is then imaged to determine its location 906. Locations of central blocks 316 determined by respective e-beam columns 206 can then be combined with stage position information to calculate offsets 908 for use by the e-beam columns 206 when targeting the substrate.

Figures 10A, 10B:
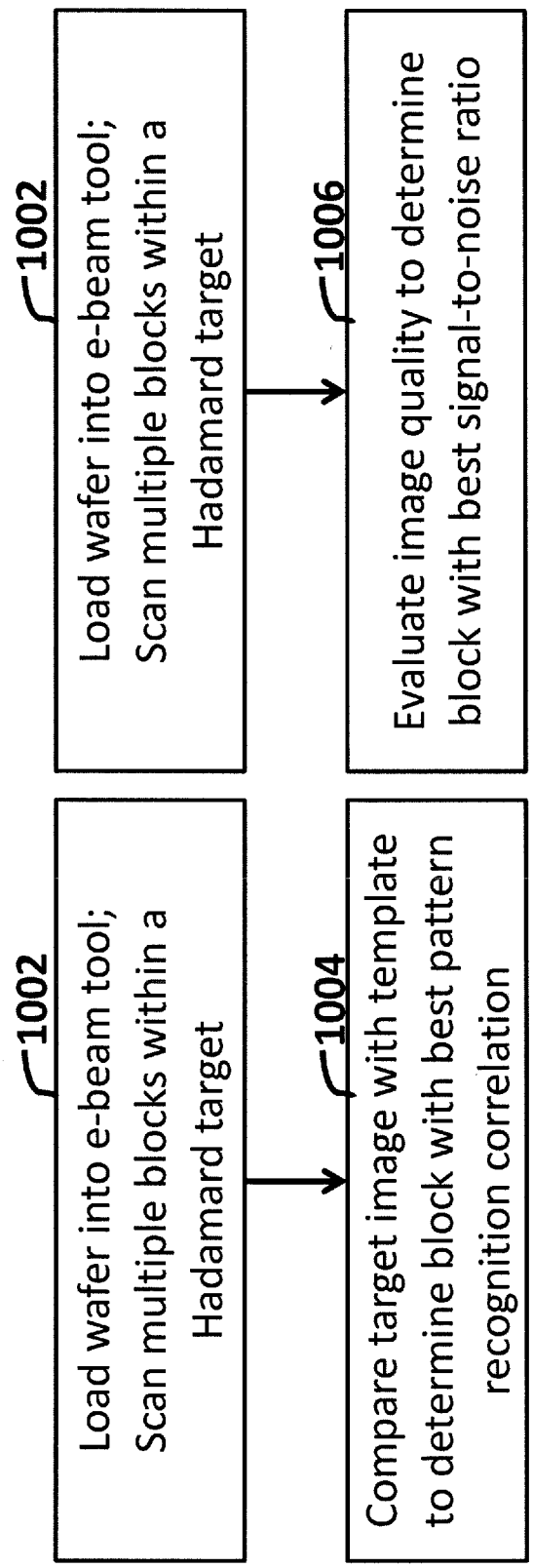
FIG. 10A shows an example process for improving pattern recognition correlation of Hadamard targets.
FIG. 10B shows an example process for improving signal-to-noise ratio of Hadamard targets.

FIGS. 10A and 10B show example processes for improving pattern recognition correlation and signal-to-noise ratio of Hadamard targets 402. A wafer 200 with multiple Hadamard targets 402 previously prepared 102 is loaded into an e-beam tool, and one or more e-beam columns 206 image multiple Hadamard target blocks 302 within one or more Hadamard targets 402 in step 1002. The resulting image(s) can be compared with (preferably) a computer-generated template (or a stored image) to determine which block 302 provides the best pattern recognition correlation 1004. The image(s) produced in step 1002 can also be evaluated to determine image quality to determine which block's 302 images result in the best signal-to-noise ratio 1006.

Block 302 imaging priority can be based on, e.g., a combination of the pattern recognition correlation and signal-to-noise ratio qualities of Hadamard target blocks 302 analyzed as discussed with respect to FIGS. 10A and 10B. Which of the blocks' 302 images results in superior pattern recognition correlation and/or signal-to-noise ratio can be related to, for example, which of the blocks' 302 patterns in a Hadamard target 402 has higher uniqueness, better image contrast, or more x and y edge information.

Figure 11:
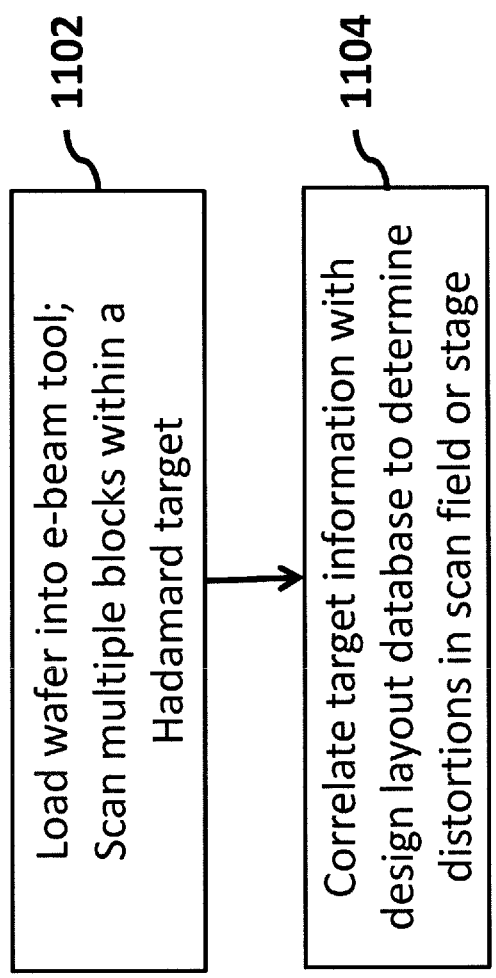
FIG. 11 shows an example process for correcting distortions.

FIG. 11 shows an example process for correcting distortions 1100. A wafer 200 with multiple Hadamard targets 402 previously prepared 102 is loaded into an e-beam tool, and one or more e-beam columns 206 image multiple Hadamard target blocks 302 at step 1102 within one or more Hadamard targets 402. The presence of distortion-related errors due to, e.g., translation, rotation, skew, magnification, and higher-order distortions, can be determined by correlating Hadamard target image information with the design layout database 1104.

Figure 12:
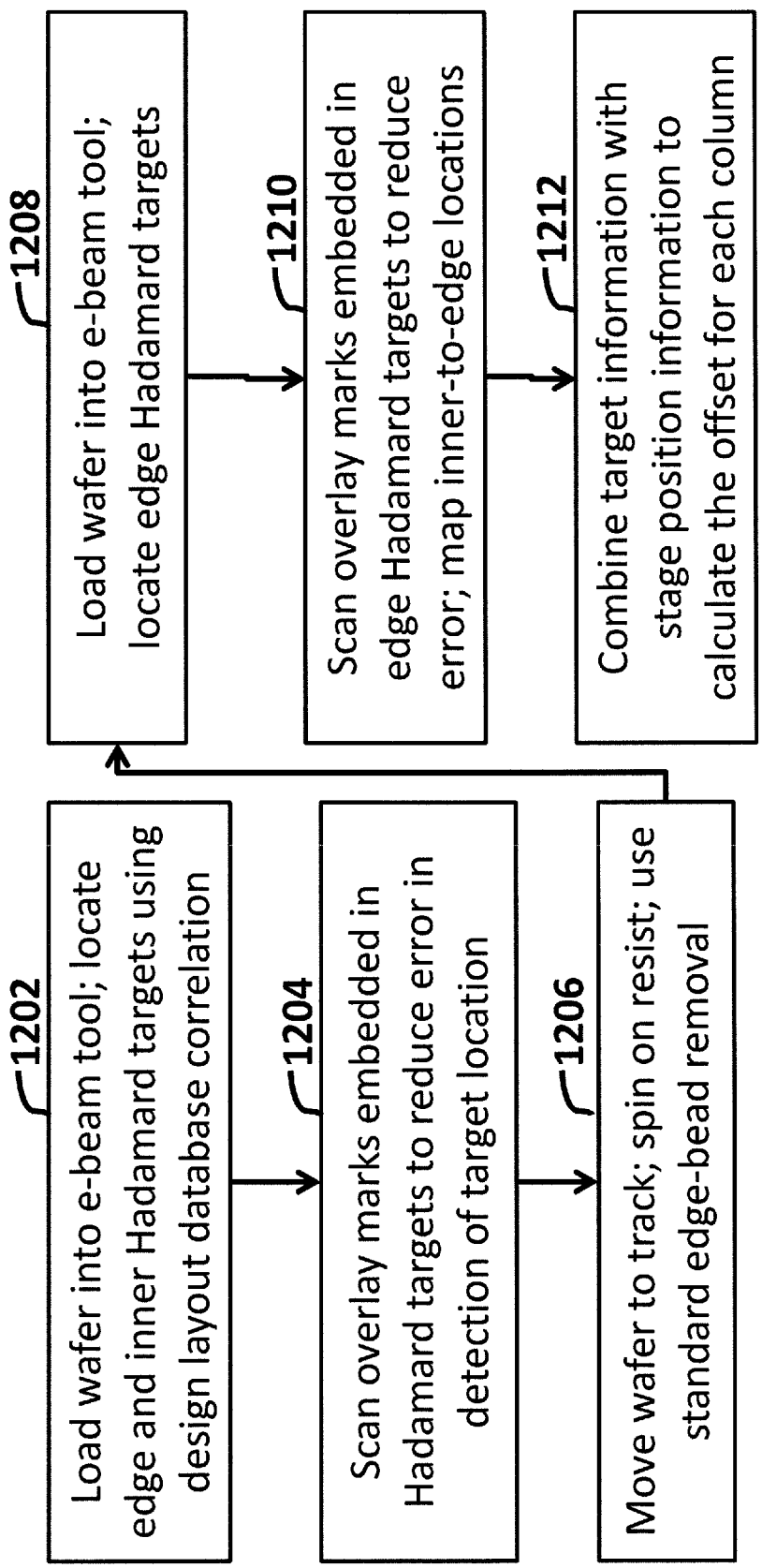
FIG. 12 shows an example process for pattern registration.

FIG. 12 shows an example process for pattern registration (layer-to-layer overlay). Layer-to-layer overlay metrology can be improved using Hadamard targets 402 with overlay marks embedded within them (e.g., within a symmetric block). Embedding an overlay mark in a symmetric Hadamard target block 302 can be used to improve overlay mark centering and lessen proximity effects, thereby reducing overlay tool-induced-shift (TIS) and process dependent wafer-induced-shift (WIS).

In some embodiments, as shown in FIG. 12, a wafer 200 with multiple edge and inner Hadamard targets 404, 406 previously prepared 102 is loaded into an e-beam tool. The wafer 200 is also prepared with non-Hadamard pattern overlay marks embedded within multiple ones of the edge and of the inner Hadamard targets 404, 406. One or more e-beam columns 206 image said edge and inner Hadamard targets 404, 406 to locate them using design layout database correlation 1202. The overlay marks embedded within the Hadamard targets 402 are also imaged to reduce error in determining target location 1204. The wafer 200 is then moved to the track, resist is spun-on, and edge-bead removal is performed to leave the edge-proximal portion of the wafer 200 on which the edge Hadamard targets 406 were written bare of resist 1206. The wafer 200 is loaded into an e-beam tool, which is used to locate the edge Hadamard targets 406 at step 1208 (using imaging and pattern recognition). The e-beam tool is also used to image the overlay marks embedded within edge Hadamard targets 406. The resulting edge Hadamard target 406 and overlay mark locations are mapped to the previously-written inner Hadamard target 404 and embedded overlay mark locations 1210 using the locations determined by the imaging of steps 1202 and 1204. Target location information and stage position information, from steps 1202, 1204, 1208 and 1210 are combined to calculate offsets for the columns 1212.

Figure 13:
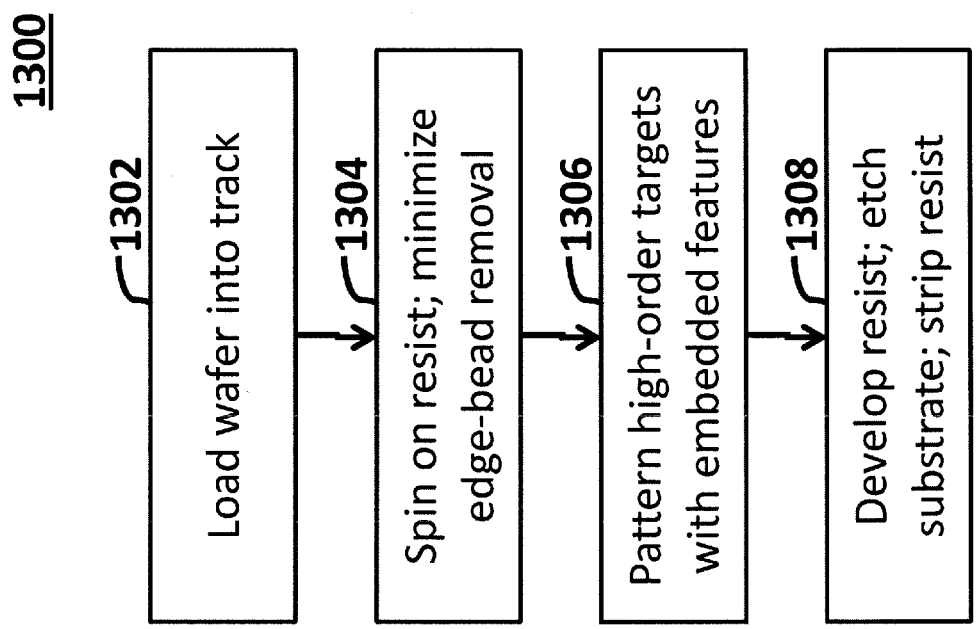
FIG. 13 shows an example process for patterning high-order Hadamard targets.

FIG. 13 shows an example process for patterning high-order Hadamard targets 402. "High-order Hadamard targets" 402 is defined herein as Hadamard targets 402 generated using $N \geq 5$ (for Hadamard and/or corresponding Walsh transform generating functions such as Equations 1 and 2). Preferably, high-order Hadamard targets 402 have order N much greater than 4, such as $N \geq 10$, to make it easier to configure high-order Hadamard targets 402 so that (generally) with initial beam parameter values and stable columns 206, at least one block 302 will be correctly imaged and at least one block 302 will not be correctly imaged. This provides, for example, both a baseline result for performance comparison, and room for differentiation in measured performance.

High-order Hadamard targets 402 can be used to perform a variety of functions, for example: stress testing design-for-manufacturability (DFM) and design-for-yield (DFY) strategies (for example, correlation scores with respect to templates could be fitted to a response surface allowing location of optimal parametric ranges); rapid design-of-experiments (DOE) optimization of e-beam parameters such as beam energy (landing voltage), beam focus, exposure time, beam current, beam size and beam scan rate (and other charged particle detection and deflection parameters); initial e-beam calibration; immediate flagging of column 206 instability based on a column's 206 off-trend or sub-threshold performance results when imaging (or writing) a high-order Hadamard target 402; providing a performance metric for column-to-column comparison; column 206 performance matching; providing a system-wide imaging quality metric; providing a persistent column 206 performance metric allowing analysis of the evolution of column 206 characteristics over time, e.g., per-column 206 and per-column-array; and as a test pattern for automatic e-beam parameter optimization for lithography (e.g., automatic e-beam parameter optimization as disclosed in U.S. application Ser. No. 14/198,145, incorporated herein by reference). These applications can be performed using, for example, size 20×20 block array Hadamard target(s) 402 (N=20) configured to contain blocks 302 with features smaller than normal design rules; advantageously, features in the size range associated with "killer defects" (defined as defects that result in loss of device functionality).

Beam performance can be measured by, for example, resolution, contrast, signal-to-noise ratio, edge-sharpness, and deflection accuracy.

In some embodiments, as shown in FIG. 13, preparation of a wafer 200 with high-order Hadamard targets 402 written thereon 1300 can be performed as follows. A wafer 200 is loaded into a track 1302, resist is spun on, and edge-bead removal is minimized 1304. High-order Hadamard targets 402 are written on the wafer 1306, comprising either or both of edge high-order Hadamard targets 406 and inner high-order Hadamard targets 404. After high-order Hadamard targets 402 are written 1306, the resist is developed, the substrate is etched, and the resist is stripped 1308 to leave behind the written pattern.

Figure 14:
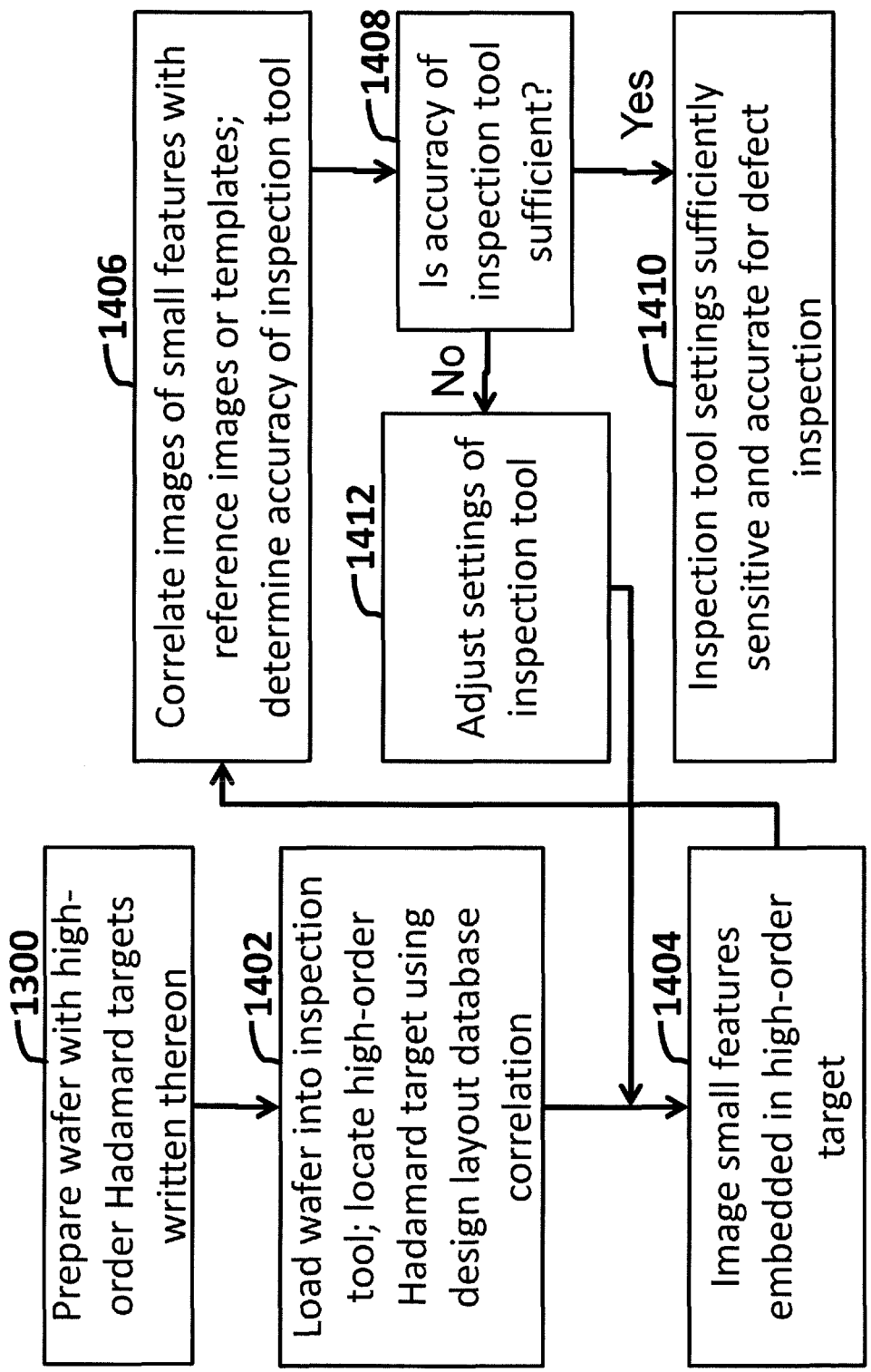
FIG. 14 shows an example process for inspection tool parameter optimization using high-order Hadamard targets.

FIG. 14 shows an example process for inspection tool parameter optimization using high-order Hadamard targets 402. Correlation of inspection tool images of high-order Hadamard targets 402 with pre-computed pattern templates or reference images can be used to select optimal inspection tool settings, and to test sensitivity and accuracy, using DOE methods.

In embodiments as shown in FIG. 24, a wafer is prepared with high-order Hadamard targets 402 written thereon 1300. To perform DOE inspection tool parameter optimization, the wafer 200 is then loaded into an inspection tool, and the tool's e-beams are used to locate respective high-order Hadamard targets 402 using design layout database correlation 1402. The tool progressively images smaller and smaller features in the high-order Hadamard targets 402 at step 1404 (or blocks 302 that are otherwise progressively more difficult to correctly image, e.g., with decreasing average or minimum feature sizes, and/or with increasing maximum density of x and/or y edge information in all or portions of the blocks 302, and/or with an increasing number of write/do-not-write transitions), correlating feature images with computer generated templates or reference images and using correlation results to determine whether the inspection tool correctly (e.g., accurately) images said progressively smaller features 1406. If the tool is able to correctly image the features, imaging continues to progress towards smaller features; and if the tool is able to correctly image sufficiently small features (e.g., meeting a pre-set standard) 1408, then the inspection tool can be deemed sufficiently sensitive and accurate for defect inspection with current parameters 1410. However, if the tool is not able to correctly image sufficiently small features, the tool's parameter settings are adjusted to stochastically improve tool performance 1410, and the process is repeated, preferably from step 1404 on.

Figure 15:
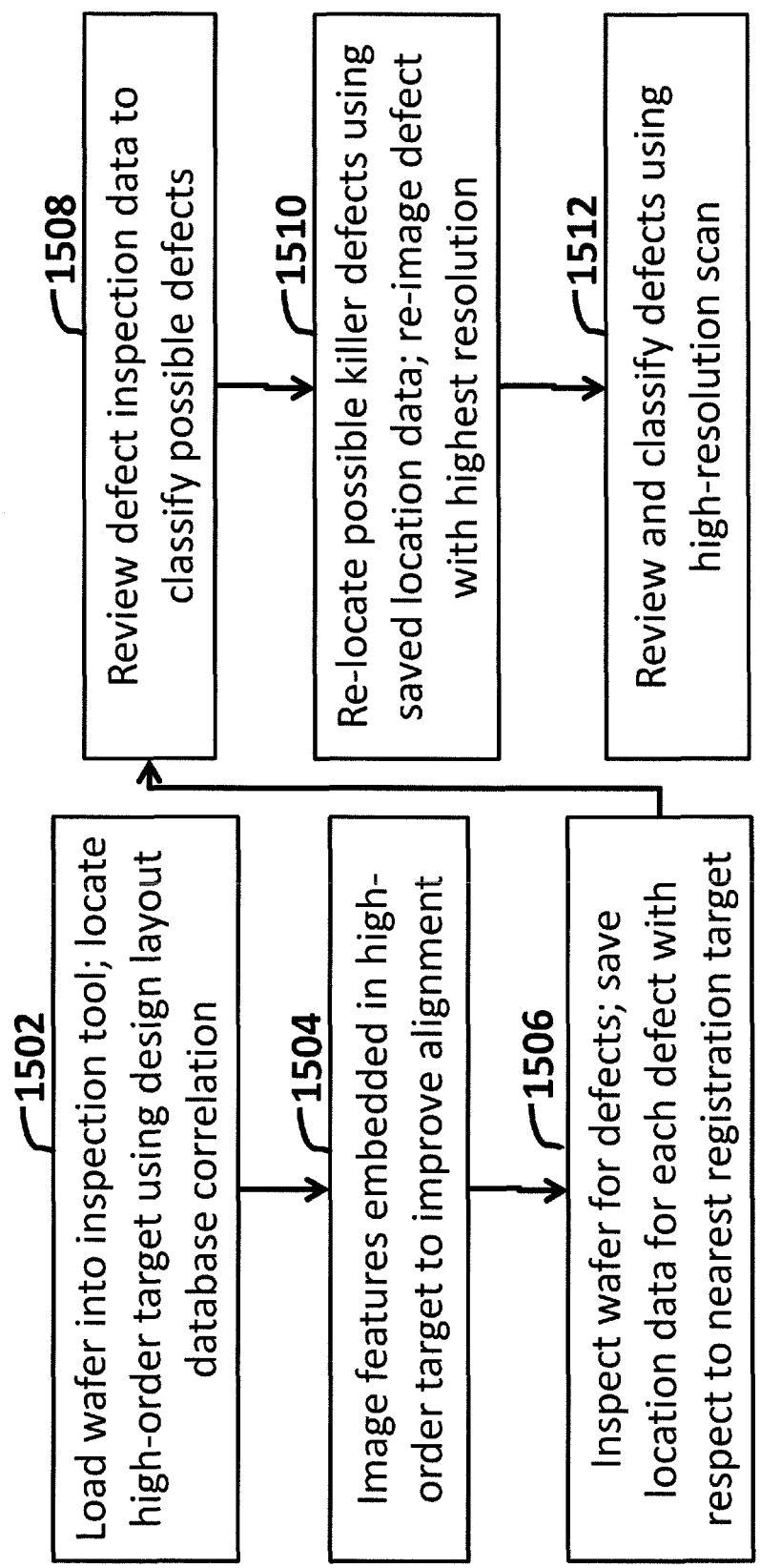
FIG. 15 shows an example process for wafer inspection.

FIG. 15 shows an example process for wafer 200 inspection. A wafer 200 written with pattern to be inspected and high-order Hadamard targets 402 (preferably at least one high-order Hadamard target 402 per column 206 to be used in inspecting for defects) is loaded into an inspection tool; and the wafer 200 is imaged to locate the high-order Hadamard targets 200 using design layout database correlation 1502. The high-order Hadamard targets 402 are imaged, and corresponding offsets are calculated, to improve alignment 1504. The wafer 200 is inspected for defects, and defect location data is saved with respect to nearest registration targets (preferably Hadamard targets 402) 1506. The inspection data is analyzed to classify possible defects 1508, and possible killer defects are re-located using saved defect location data and re-imaged using the e-beam column array's highest resolution 1510. Defects are reviewed and classified using the data resulting from the step 1510 high-resolution scan 1512.

Figure 16:
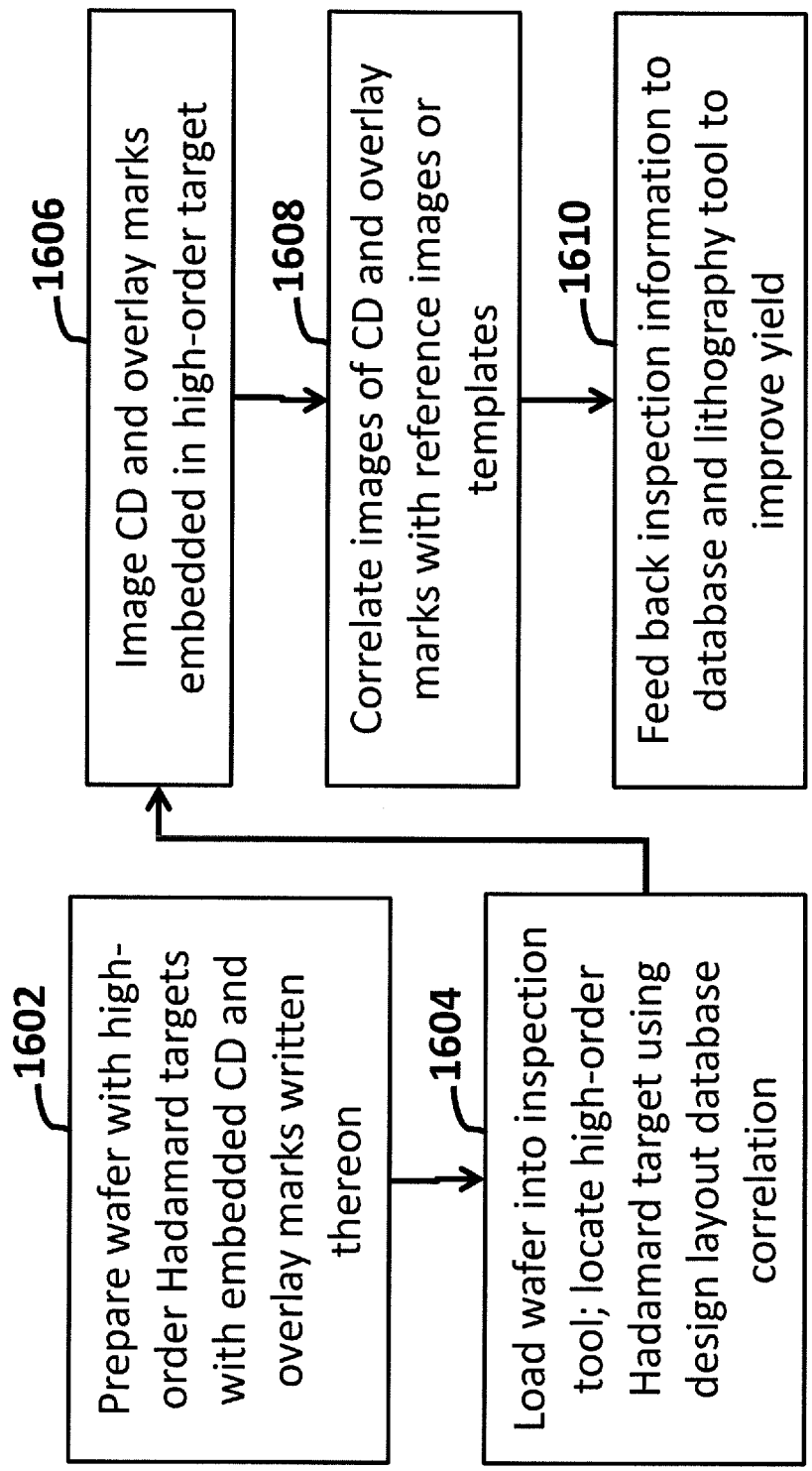
FIG. 16 shows an example process for improving critical dimension (CD) and overlay metrology.

FIG. 16 shows an example process for improving critical dimension (CD) and overlay metrology. A wafer is prepared with high-order Hadamard targets 402 written thereon 1300; except that, at step 1306, high-order Hadamard targets 402 are written with critical dimension (CD) control marks and (or and/or) overlay marks embedded therein 1602. The resulting composite high-order Hadamard targets can be imaged and analyzed to improve CD and overlay metrology 1604. The substrate is loaded into an EBI tool, and the composite high-order Hadamard targets, and the CD and overlay marks within particular blocks 302 of the high-order Hadamard targets 402, are located using design layout database correlation 1606. The CD and overlay marks are imaged 1608, and the resulting image data is correlated (pattern recognition is performed) with (preferably) computer generated templates or (less preferred) reference images. Inspection data from this imaging and analysis is fed back to the design layout database and/or lithography tool(s) 1610 e.g., for use in making design modifications and tool parameter modifications, and to help designate care areas for higher-resolution inspection, to improve yield.

As shown, a multi-column e-beam inspection system can be configured as a massively parallel CD, overlay, and defect control solution to improve both parametric and functional yield.

Figure 17A:
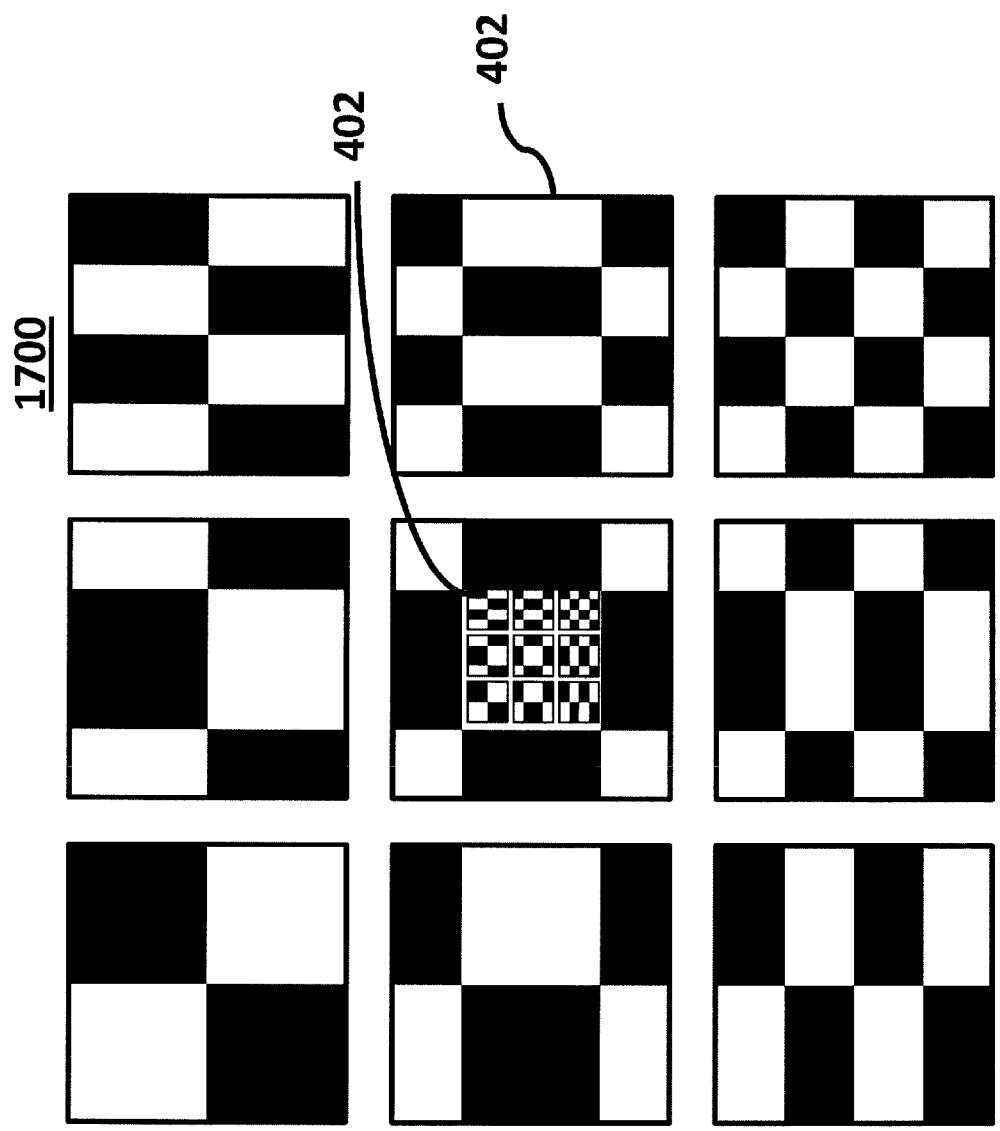
FIG. 17A schematically shows an example of nested Hadamard targets.

FIG. 17A schematically shows an example of nested Hadamard targets 1700. (In FIGS. 17A, 17B, 18A, 18B and 18C, borders are included solely to clearly delineate Hadamard target blocks 302.) In some embodiments, as shown in FIG. 17A, nested Hadamard targets 1700 can be sized to fit within a single scan field 604. Alternatively, nested Hadamard targets 1700 can span a larger area, up to an entire wafer 200. Nested Hadamard targets 1700 can also be regularly or irregularly scattered across wafers 200 (e.g., production wafers). A nested Hadamard target 1700 comprises a (relatively) larger outer Hadamard target 402 with one or more smaller Hadamard targets 402 (optionally, recursively) within the larger target 402. Scan fields containing nested Hadamard targets 1700 can be located, for example, between dies or between reticle fields.

Figure 17B:
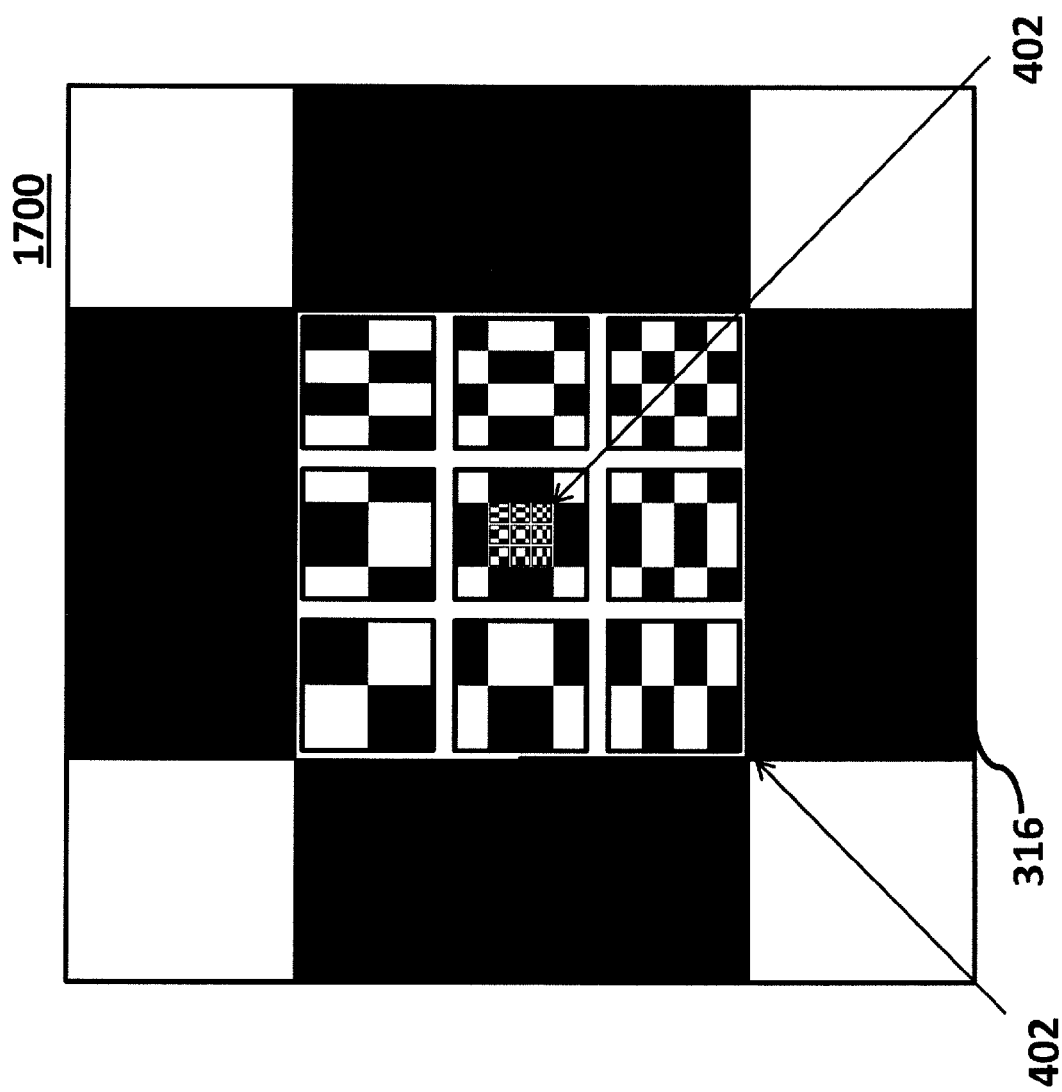
FIG. 17B schematically shows an example of nested Hadamard targets.

FIG. 17B schematically shows an example of nested Hadamard targets 1700. This is an example of a triply nested Hadamard target—a small Hadamard target 402 centered in a second Hadamard target 402 which in turn is centered in the symmetric central block 316 of a third Hadamard target 402 (only the symmetric central block 316 of the outermost target is shown here due to scale issues). This also comprises an example of an overlay mark embedded in a symmetric Hadamard target block 302.

Hadamard targets 402 are easily nested in symmetric central blocks 316 (or other blocks) to a number of levels limited by the resolution limits of the lithography tool. This allows precision and accuracy to be increased arbitrarily to the physical limits of the tool.

Figure 18A:
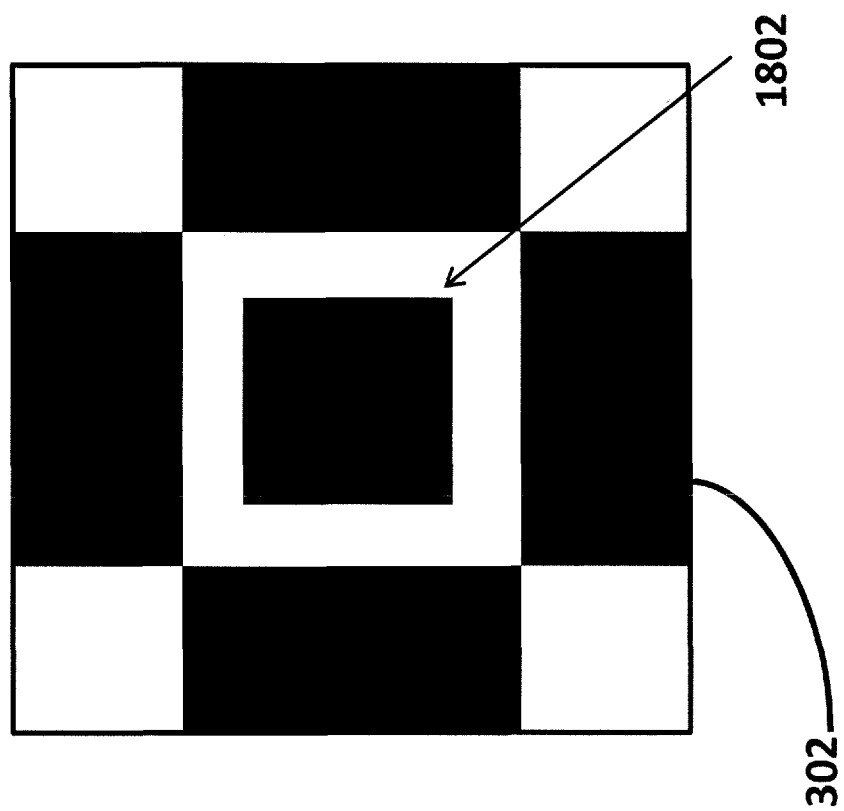
FIGS. 18A, 18B and 18C schematically show examples of conventional overlay marks nested in symmetric Hadamard target blocks.
Figure 18B:
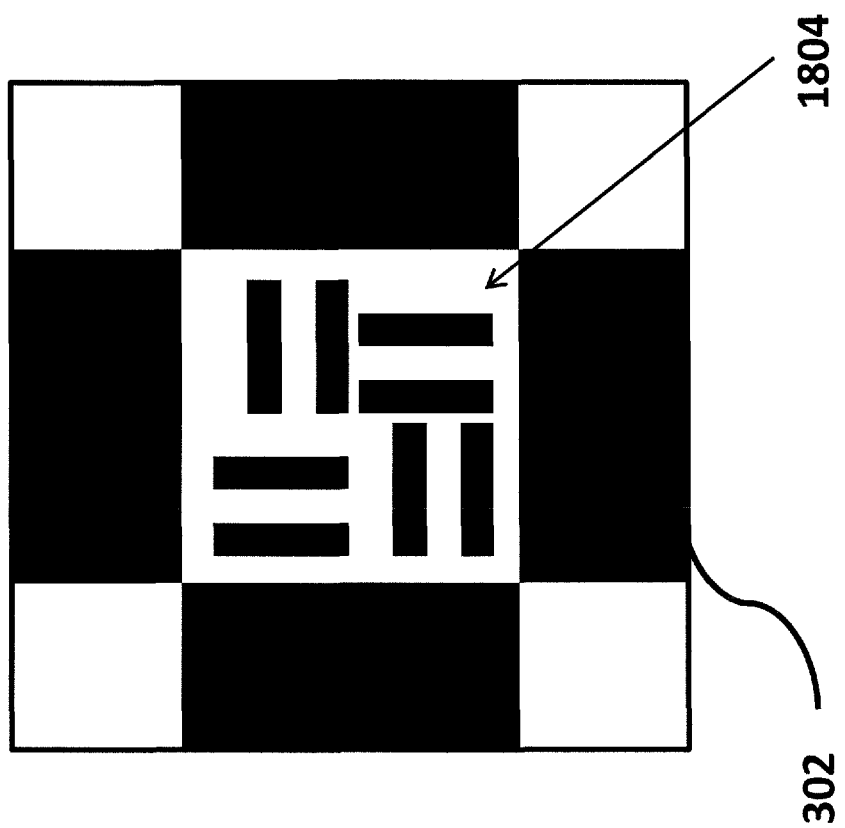
Figure 18C:
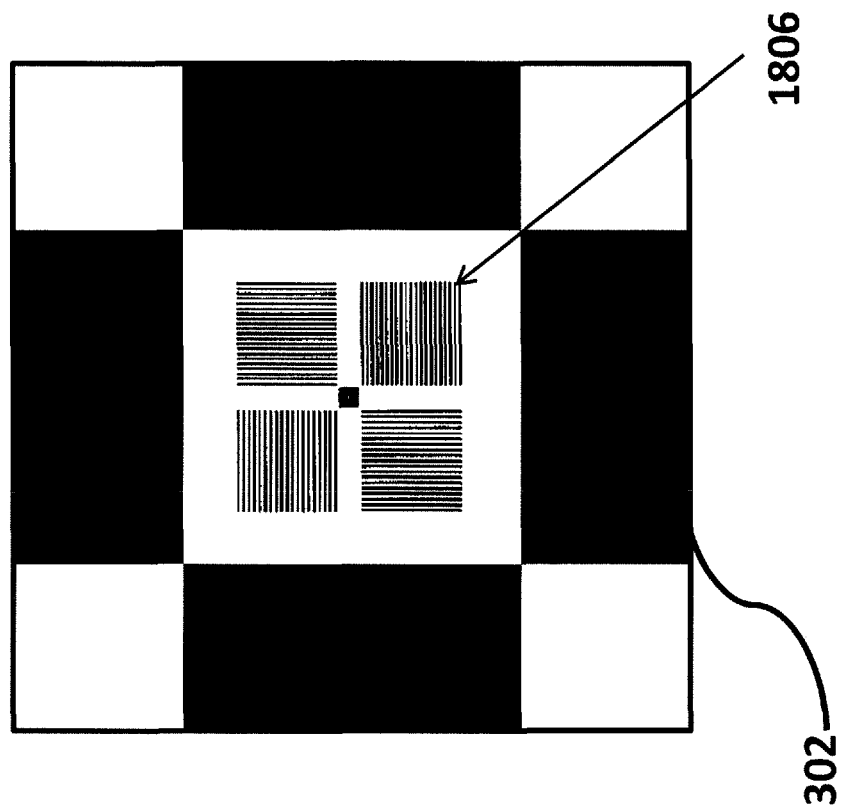

FIGS. 18A, 18B and 18C schematically show examples of conventional overlay marks nested in symmetric Hadamard target blocks 302. Box-in-box 1802, bar-in-bar 1804 and grating targets 1806 are embeddable in Hadamard target blocks 302 (e.g., in a central 316 and/or symmetric Hadamard target block 302), and can be used for overlay control. The symmetric Hadamard block 302 provides excellent protection from optical-proximity and etch-loading effects for these "nested" targets.

Figure 19:
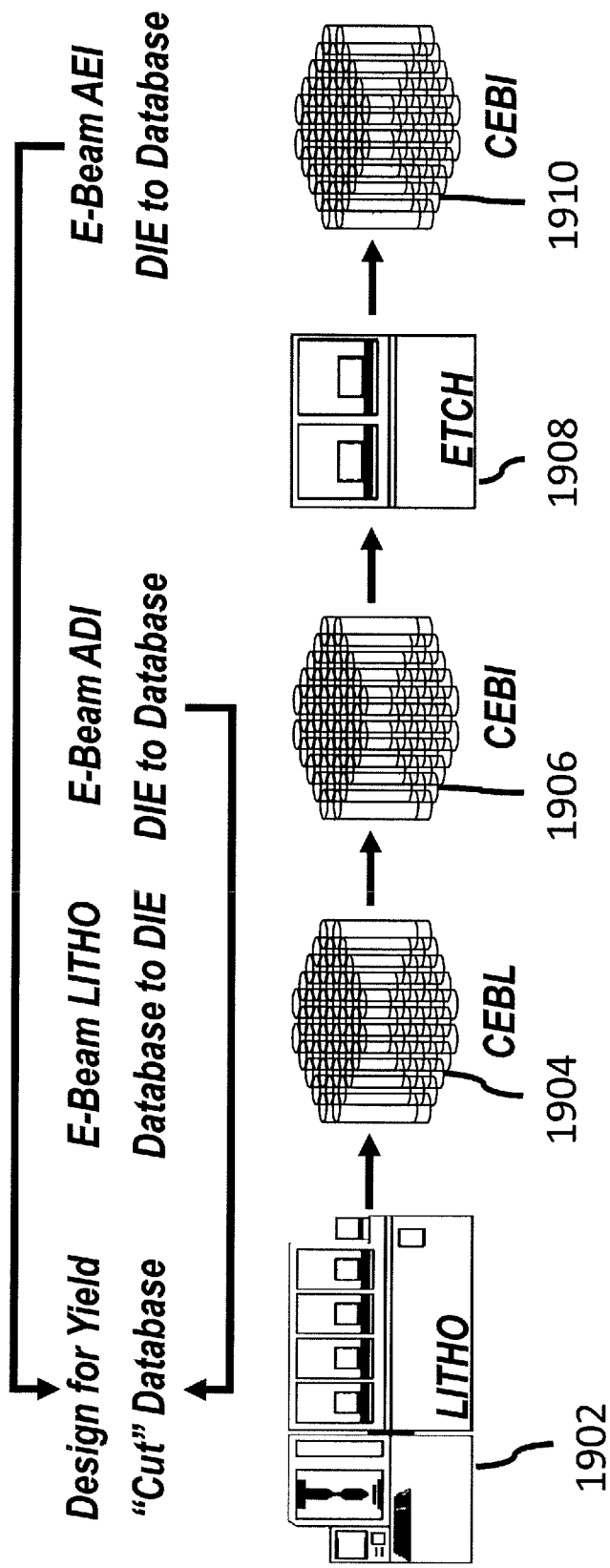
FIG. 19 shows an example process flow for e-beam lithography and inspection.

FIG. 19 shows an example process flow for e-beam lithography and inspection. Optical lithography 1902 is followed by CEBL 1904 based on a DFY "cut" database—line cuts specified by the design layout database are patterned on the wafer 200. After development EBI 1906 (ADI, or after development inspection, using complementary EBI, or CEBI) is followed by a resist etch step 1908 and then by after etch EBI 1910 (AEI, or after etch inspection, using CEBI). ADI and AEI can both be accomplished by comparing images of dies 208 to contents of the design layout database. Results of alignment and/or registration or other imaging of Hadamard targets 402 with or without embedded or nested overlay or other marks, or of imaging of high-order Hadamard targets 402 with or without embedded CD or overlay or other marks, can be fed backwards or forwards between (or among) the design layout database and the CEBL, ADI, etch and AEI processes, to enable design layout and/or beam parameter and/or etch parameter modification to stochastically improve lithography and inspection performance and yield rate.

According to some but not necessarily all embodiments, there is provided: A method of substrate lithography and/or inspection using charged particle beam columns, comprising the actions of: a) writing multiple Hadamard targets onto the substrate using multiple first charged particle beams; b) imaging said Hadamard targets using multiple second charged particle beams; c) calculating offsets for respective ones of said second beams in at least partial dependence on said imaging; and d) writing and/or imaging multiple cut features using said second beams, said features being targeted in at least partial dependence on said offsets, wherein individual ones of said beams are projected by individual ones of the columns, and different ones of the columns have different writing areas.

According to some but not necessarily all embodiments, there is provided: A method of substrate lithography and/or inspection using charged particle beam columns, comprising the actions of: a) writing multiple edge Hadamard targets and multiple inner Hadamard targets onto the substrate using multiple first charged particle beams; b) first imaging said edge and inner Hadamard targets using said first beams; c) adding a resist layer to the substrate such that imaging said inner Hadamard targets is prevented and imaging said edge Hadamard targets is enabled; d) second imaging said edge Hadamard targets using multiple second charged particle beams; e) calculating offsets for respective ones of said second beams in at least partial dependence on said first imaging and said second imaging; and f) writing and/or imaging multiple cut features on the substrate using said second beams, said features being targeted in at least partial dependence on said offsets, wherein individual ones of said beams are projected by individual ones of the columns, and different ones of the columns have different writing areas.

According to some but not necessarily all embodiments, there is provided: A method of substrate lithography and/or inspection using multiple charged particle beam columns, comprising the actions of: a) writing multiple edge targets and multiple inner targets onto the substrate using multiple first charged particle beams; b) first imaging said edge and inner targets using respective ones of said first beams; c) adding a resist layer to the substrate such that imaging said inner targets is prevented and imaging said edge targets is enabled; d) second imaging said edge targets using multiple second charged particle beams; e) calculating offsets for respective ones of said second beams in at least partial dependence on said first imaging and said second imaging; and f) writing and/or imaging multiple cut features on the substrate using said second beams, said features being targeted in at least partial dependence on said offsets, wherein individual ones of said beams are projected by individual ones of the columns, and different ones of the columns have different writing areas.

According to some but not necessarily all embodiments, there is provided: A method of substrate inspection using multiple charged particle beam columns, comprising: a) writing high-order Hadamard targets to the substrate using multiple first charged particle beams; b) imaging multiple features in said high-order Hadamard targets using multiple second charged particle beams; c) measuring beam performance in at least partial dependence on said imaging, and determining which of said features were correctly imaged in step b); d) until one or more features of a threshold size are correctly imaged, modifying beam parameters of said second beams in at least partial dependence on said measuring to stochastically improve beam performance, and repeating steps b) and c), targeting one or more features in said repeated step b) that are smaller than those previously determined as correctly imaged; and e) imaging multiple cut features on the substrate using said second beams with said modified beam parameters, wherein individual ones of said beams are projected by individual ones of the columns, and different ones of the columns have different writing areas.

According to some but not necessarily all embodiments, there is provided: A substrate lithography and inspection tool, comprising: a substrate stage; multiple charged particle beam columns, individual ones of said columns configured to produce an individual charged particle beam, different ones of said columns having different writing areas; and one or more column controllers storing instructions in a computer-readable non-transitory medium that, when executed, direct said beam controllers to: control said columns to write multiple Hadamard targets onto the substrate; image said Hadamard targets; calculate offsets for said columns in at least partial dependence on said image action; and control said columns to write and/or image multiple cut features, said features being targeted in at least partial dependence on said offsets.

According to some but not necessarily all embodiments, there is provided: A substrate lithography and inspection tool, comprising: a substrate stage; multiple charged particle beam columns, individual ones of said columns configured to produce an individual charged particle beam, different ones of said columns having different writing areas; and one or more column controllers storing instructions in a computer-readable non-transitory medium that, when executed, direct said beam controllers to: control said columns to write multiple edge Hadamard targets and multiple inner Hadamard targets in multiple writing areas on the substrate; control said columns to first image said edge and inner Hadamard targets; control said columns to second image said edge Hadamard targets using; and calculate offsets for respective ones of said columns in at least partial dependence on said first image action and said second image action; and control said columns to write and/or image multiple cut features on the substrate, said features being targeted in at least partial dependence on said offsets.

According to some but not necessarily all embodiments, there is provided: A substrate lithography and inspection tool, comprising: a substrate stage; multiple charged particle beam columns, individual ones of said columns configured to produce an individual charged particle beam, different ones of said columns having different writing areas; and one or more column controllers storing instructions in a computer-readable non-transitory medium that, when executed, direct said beam controllers to: control said columns to write multiple edge targets and multiple inner targets in multiple writing areas on the substrate; control said columns to first image said edge and inner targets; control said columns to second image said edge targets; calculate offsets for respective ones of said columns in at least partial dependence on said first image action and said second image action; and control said columns to write and/or image multiple cut features on the substrate said features being targeted in at least partial dependence on said offsets.

According to some but not necessarily all embodiments, there is provided: A substrate lithography and inspection tool, comprising: a substrate stage; multiple charged particle beam columns, individual ones of said columns configured to produce an individual charged particle beam, different ones of said columns having different writing areas; and one or more column controllers storing instructions in a computer-readable non-transitory medium that, when executed, direct said beam controllers to: control said columns to write multiple high-order Hadamard targets in multiple writing areas on the substrate; control said columns to image multiple features in said high-order Hadamard targets; measure performance in at least partial dependence on said imaging, and determine which of said features were correctly imaged; until one or more features of a threshold size are correctly imaged, modify beam parameters of said columns in at least partial dependence on said measuring to stochastically improve beam performance, and controlling said columns to repeat said image multiple target features action, said measure action and said determine action, targeting one or more features in said repeated image action that are smaller than those previously determined as correctly imaged; and controlling said columns to image multiple cut features on the substrate using said columns with said modified beam parameters.

According to some but not necessarily all embodiments, there is provided: methods, systems and devices for using charged particle beam tools to pattern and inspect a substrate. The inventors have discovered that it is highly advantageous to use patterns generated using the Hadamard transform as alignment and registration marks (Hadamard targets) for multiple-column charged particle beam lithography and inspection tools. Further, superior substrate alignment and layer-to-layer pattern registration accuracy can be achieved using Hadamard targets patterned in edge-proximal portions of the substrate that are typically stripped bare of resist prior to lithography, in addition to Hadamard targets patterned in inner substrate portions. High-order Hadamard targets can also be patterned and imaged to obtain superior column performance metrics for applications such as super-rapid beam calibration DOE, column matching, and column performance tracking. Superior alignment and registration, and column parameter optimization, allow significant yield gains.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Some embodiments are disclosed herein with respect to wafers. Those skilled in the art will understand that other types of substrates can also be used.

Some embodiments are disclosed herein using electron beams and electron beam columns. Those skilled in the art of charged particle beam lithography will understand that the inventions disclosed herein can also be embodied using other types of charged particle beams and miniature charged particle beam columns.

Some embodiments disclosed herein refer only to one or the other of registration and alignment. It will be apparent to one of ordinary skill in the arts of charged particle beam lithography and inspection that some or all of such embodiments can be applied to both registration and alignment.

In some embodiments disclosed herein using edge targets and referring specifically to Hadamard targets, other alignment and/or registration mark patterns can be used (e.g., checkerboard patterns, grating patterns, box-in-box patterns or bar-in-bar patterns) instead of Hadamard targets.

It will be apparent to those of ordinary skill in the art that, with respect to some portrayals of size 16×16 sequency-ordered Hadamard matrices, FIG. 3 is further permuted, as follows. For integer i and j such that (i mod 4)=(j mod 4)=0, each 4×4 region comprising (row, column) indices in the range (i ... i+3, j ... j+3), starting with index (0, 0), has been rotated counterclockwise by 90 degrees (pi/2 radians). This corresponds to rotating individual blocks counterclockwise by 90 degrees.

In some embodiments, different Hadamard targets 402 can be oriented differently on a wafer 200—i.e., an entire Hadamard target 402 rotated with respect to another Hadamard target 402.

In some embodiments, the same intra-block permutations are performed on all blocks 302 in a Hadamard target 402. In some embodiments, different intra-block permutations are performed on some or all blocks 302 in a Hadamard target 402.

In some embodiments, allowable permutations within a block that maintain edges between adjacent cells include sign-change of the entire block 302; reflection of the block 302 about the x and/or y axis (replacing the block 302 with its mirror image); or rotation of the entire block 302 around its center by one, two or three quarter-turns (k*pi/2 radians, for integer k, 0<k<4).

In some embodiments in which functions and/or algorithms are used to generate a Hadamard transform that do not result in $N^2$ basis vectors of $N^2$ elements, "blocks" are defined as those non-overlapping portions covering (tiling) the Hadamard target 402 pattern, of size 4×4 or larger, that result in binary correlation of pairs of blocks being 0.

In some embodiments, blocks in one or more Hadamard targets written to a substrate are rearranged (transposed) and the resulting Hadamard targets (the blocks of which can be transposed the same way or in different ways, depending on, e.g., application and the level of security and/or uniqueness desired) are used to identify, track, and/or authenticate the resulting individual product unit (e.g., die) or batch of product units. This can be used for, for example, anti-counterfeit measures.

In some embodiments, Hadamard target 402 patterns can be selected so that Hadamard target 402 portions smaller than blocks 302 are unique with respect to other Hadamard target 402 portions of the same size.

In some embodiments, when preparing for write iterations following edge Hadamard target writing, edge-bead removal is performed to remove sufficient resist from edge-proximal portions of the wafer to sufficiently expose the edge Hadamard targets for imaging and alignment and/or registration.

In some embodiments, steps 118 and 120 are performed by an EBI tool after, e.g., registration/alignment and patterning using an EBL or combined EBL/EBI tool.

In some embodiments using edge targets, some or all targets are not Hadamard targets.

In some embodiments using edge targets, edge targets are written to a substrate in locations corresponding to all or substantially all columns with writing areas containing edge-proximal portions of the substrate.

In some embodiments (e.g., when insufficient substrate surface area is available for a complete Hadamard target), fewer than all blocks in a Hadamard target are written to a substrate. For example, a 2×3 array of blocks out of a 3×3 array Hadamard target.

In some embodiments, DOE imaging of high-order Hadamard targets is performed out-of-order with respect to sizes of features being imaged.

In some embodiments, it can be acceptable for no blocks in a high-order Hadamard target to be correctly imaged using initial beam parameter values, e.g., where multiple other initial beam parameter value candidates are available.

In some embodiments, e.g., where correct imaging of one or more particular ones of the blocks or features in a high-order Hadamard target corresponds to a threshold for adequate beam performance, it can be acceptable for all blocks in a high-order Hadamard target to be correctly imageable by a column.

In some embodiments, a threshold feature size of a high-order Hadamard target is required to be correctly imaged multiple times before the imaging beam is considered sufficiently accurate for defect inspection.

It will be apparent to those of ordinary skill in the arts of charged particle beam lithography and inspection that while embodiments have been described with respect to particular charged particle detection and deflection parameters, to the extent other such parameters are adjustable, their effects can also be analyzed and their values optimized as disclosed hereinabove.

In some embodiments using Hadamard targets, edge targets are not used.

In some embodiments (e.g., in which not all columns in an array will be writing and/or imaging patterns), targets are written by less than all columns in an array, and/or less than all columns in an array are aligned and/or registered.

In some embodiments, one, some, or all of the columns can have one or multiple Hadamard targets located within their respective writing and/or inspection areas; within particular stripes; within particular frames; and/or within particular scan fields.

In some embodiments, high-order Hadamard targets can be configured to contain one or more blocks effectively imageable using default or typical EBI e-beam parameter settings.

In some embodiments, high-order Hadamard targets can be configured to contain blocks comprising a range of average and/or minimum feature sizes which can be used to refine lithography and/or inspection parameters and/or e-beam parameters.

In some embodiments, some or all edge targets and/or some or all inner targets are high-order Hadamard targets, and/or some or all edge targets and/or some or all inner targets are non-high-order Hadamard targets.

In some embodiments, Hadamard targets are generated using algorithms or functions used to compute Hadamard and/or Walsh transform outputs other than those given in Equations 1 and 2.

Some embodiments involving parameter optimization use one or more of multiple starting conditions, periodic parameter randomization, or historical performance comparisons; e.g., to avoid parameter refinement becoming trapped in local maxima of relevant performance criteria.

In some embodiments, Hadamard targets and/or high-order Hadamard targets are located between dies and/or between reticle fields.

Additional general background, which helps to show variations and implementations, may be found in the following publications, all of which are hereby incorporated by reference: Rafael C. Gonzalez and Richard E. Woods, *Digital Image Processing*, Addison-Wesley, 1992; Yoann Blancquaert and Christophe Dezauzier, "Diffraction based overlay and image based overlay on production flow for advanced technology node.", Proc. SPIE Vol. 8681, 2013; Yen-Liang Chen, et al., "Reduction of image-based ADI-to-AEI overlay inconsistency with improved algorithm", Proc. SPIE Vol. 8681, 2013; Nuriel Amir, et al., "Multi layer overlay measurement recent developments", Proc. SPIE Vol. 8681, 2013; T. Kato, et al., "Fundamentals of overlay measurement and inspection using scanning electron-microscope", Proc. SPIE Vol. 8681, 2013; Charlie Chen, et al., "DCM: device correlated metrology for overlay measurements", Proc. SPIE Vol. 8681, 2013; Osamu Inoue, et al., "In-die overlay metrology by using CD-SEM", Proc. SPIE Vol. 8681, 2013; Cen Shawn Wu, et al., "High-energy electron beam lithography for nanoscale fabrication", *Lithography, INTECH*, 2010; U.S. Pat. No. 7,271,907; U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; and U.S. Pat. No. 8,384,048.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. patent application Ser. No. 14/085,768; and U.S. patent application Ser. No. 14/198,145.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of substrate lithography and/or inspection using charged particle beam columns, comprising the actions of:
   a) writing multiple Hadamard targets onto the substrate using multiple first charged particle beams;
   b) imaging said Hadamard targets using multiple second charged particle beams;
   c) calculating offsets for respective ones of said second beams in at least partial dependence on said imaging; and
   d) writing and/or imaging multiple cut features using said second beams, said features being targeted in at least partial dependence on said offsets,
   wherein individual ones of said beams are projected by individual ones of the columns, and different ones of the columns have different writing areas.

2. The method of substrate lithography and/or inspection of claim 1, wherein, in step a), said first beams write at least one Hadamard target in the writing area of each column projecting said second beams.

3. The method of substrate lithography and/or inspection of claim 1, wherein said first beams are produced by the same EBI and/or EBL tool, and/or by the same array of columns, and/or by the same columns, as said second beams.

4. The method of substrate lithography and/or inspection of claim 1, wherein the substrate is moved from one stage to a different stage between step a) and step b).

5. The method of substrate lithography and/or inspection of claim 1, wherein different ones of said beams perform said writing and/or said imaging differently and simultaneously.

6. The method of substrate lithography and/or inspection of claim 1, wherein said offsets are calculated also in at least partial dependence on the design layout database of the substrate and the position of the stage on which the substrate is mounted.

7. The method of substrate lithography and/or inspection of claim 1, wherein said Hadamard targets comprise edge Hadamard targets and inner Hadamard targets.

8. The method of substrate lithography and/or inspection of claim 1, wherein, when preparing the substrate for step a), edge-bead removal is minimized.

9. The method of substrate lithography and/or inspection of claim 1, wherein said cut features comprise line-cuts and holes.

10. The method of substrate lithography and/or inspection of claim 1, wherein said imaging said Hadamard targets comprises initial-imaging expected locations of center and/or most-symmetric blocks of said Hadamard targets at least sufficiently to determine which portions of said Hadamard targets were imaged, calculating actual locations of said blocks in at least partial dependence on said initial-imaging, and refined-imaging at said actual locations.

11. The method of substrate lithography and/or inspection of claim 1, wherein at least some of said Hadamard targets are high-order Hadamard targets.

12. The method of substrate lithography and/or inspection of claim 11, wherein said imaging cut features comprises inspecting said cut features for defects using said second beams, classifying possible defects in said cut features in at least partial dependence on said inspecting, optimizing beam parameters of said second beams for highest resolution using said high-order Hadamard targets, re-imaging possible killer defects using said highest resolution, and classifying said possible defects in at least partial dependence on said re-imaging.

13. The method of substrate lithography and/or inspection of claim 1, wherein said first beams write cut features to the substrate in addition to said Hadamard targets.

14. The method of substrate lithography and/or inspection of claim 1, wherein two or more of the blocks in at least one of said Hadamard targets are transposed within said Hadamard target.

15. The method of substrate lithography and/or inspection of claim 14, wherein said Hadamard targets comprising transposed blocks are used to identify, track, and/or authenticate the individual substrate-derived product unit to which they are written.

16. A method of substrate inspection using multiple charged particle beam columns, comprising:
  a) writing high-order Hadamard targets to the substrate using multiple first charged particle beams;
  b) imaging multiple features in said high-order Hadamard targets using multiple second charged particle beams;
  c) measuring beam performance in at least partial dependence on said imaging, and determining which of said features were correctly imaged in step b);
  d) until one or more features of a threshold size are correctly imaged, modifying beam parameters of said second beams in at least partial dependence on said measuring to stochastically improve beam performance, and repeating steps b) and c), targeting one or more features in said repeated step b) that are smaller than those previously determined as correctly imaged; and
  e) imaging multiple cut features on the substrate using said second beams with said modified beam parameters,
  wherein individual ones of said beams are projected by individual ones of the columns, and different ones of the columns have different writing areas.

17. The method of substrate inspection of claim 16, wherein said beam parameters are selected from: beam energy, beam focus, exposure time, beam current, beam landing energy, beam size, and beam scan rate.

18. The method of substrate inspection of claim 16, wherein said measuring uses criteria selected from: beam resolution, contrast, signal-to-noise ratio, edge-sharpness, and deflection accuracy.

19. The method of substrate inspection of claim 16, wherein the substrate is not removed from the stage between step b) and step e).

20. The method of substrate inspection of claim 16, wherein said targets are generated using the discrete Hadamard and/or Walsh transform basis kernels using $N \geq 10$.

21. The method of substrate inspection of claim 16, wherein said targets are configured such that, using initial and/or non-optimized beam parameters, at least some features of said targets can be correctly imaged and at least some target features cannot be correctly imaged.

22. The method of substrate inspection of claim 16, wherein, prior to step e), steps b) through d) are repeated multiple times, on one or more different substrates, using multiple different high-order Hadamard targets comprising either or both of (1) a high-order Hadamard target with transposed blocks, or (2) multiple different Hadamard and/or Walsh transform-derived patterns.

23. The method of substrate inspection of claim 16, wherein if, within a specified number of iterations of step d) or a specified amount of time, said measured beam performance of a particular one of said second beams fails to reach a pass threshold or decreases significantly with respect to prior measured beam performance, or said particular second beam fails to correctly image features of said threshold size, then the corresponding column is inspected for defects and/or repaired and/or replaced.

24. The method of substrate inspection of claim 16, wherein columns with similar said measured beam performance, from multiple different arrays of columns, are placed into a single array of columns, and said single array of columns is used to write and/or to inspect multiple cut features on one or more substrates.

25. The method of substrate inspection of claim 16, wherein steps b) through d) are repeated until the rate of improvement in measured beam performance and/or the rate of decrease in correctly imaged feature size falls below a threshold rate.

26. The method of substrate inspection of claim 16, wherein two or more of the blocks in at least one of said Hadamard targets are transposed within said Hadamard target.

27. The method of substrate inspection of claim 26, wherein said Hadamard targets comprising transposed blocks are used to identify, track, and/or authenticate the individual substrate-derived product unit to which they are written.

28. A substrate lithography and inspection tool, comprising:
  a substrate stage;
  multiple charged particle beam columns, individual ones of said columns configured to produce an individual charged particle beam, different ones of said columns having different writing areas; and
  one or more column controllers storing instructions in a computer-readable non-transitory medium that, when executed, direct said beam controllers to:
  control said columns to write multiple Hadamard targets onto the substrate;
  image said Hadamard targets;
  calculate offsets for said columns in at least partial dependence on said image action; and
  control said columns to write and/or image multiple cut features, said features being targeted in at least partial dependence on said offsets.

29. The substrate lithography and inspection tool of claim 28, wherein said column controllers are configured to control said columns to write at least one Hadamard target in the writing area of each column performing said write and/or image multiple cut features action.

30. The substrate lithography and inspection tool of claim 28, wherein said column controllers are configured to control different ones of said columns to perform said write actions and said image actions differently and simultaneously.

31. The substrate lithography and inspection tool of claim 28, wherein said column controllers are configured to calculate said offsets also in at least partial dependence on the design layout database of the substrate and the position of the stage on which the substrate is mounted.

32. The substrate lithography and inspection tool of claim 28, wherein said Hadamard targets comprise edge Hadamard targets and inner Hadamard targets.

33. The substrate lithography and inspection tool of claim 28, wherein said cut features comprise line-cuts and holes.

34. The substrate lithography and inspection tool of claim 28, wherein said image Hadamard targets action comprises initial-imaging expected locations of center and/or most-symmetric blocks of said Hadamard targets at least sufficiently to determine which portions of said Hadamard targets were imaged, calculating actual locations of said blocks in at least partial dependence on said initial-imaging, and refined-imaging at said actual locations.

35. The substrate lithography and inspection tool of claim 28, wherein at least some of said Hadamard targets are high-order Hadamard targets.

36. The substrate lithography and inspection tool of claim 35, wherein said image cut features action comprises inspecting said cut features for defects using said columns, classifying possible defects in said cut features in at least partial dependence on said inspecting, optimizing beam parameters of said columns for highest resolution using said high-order Hadamard targets, re-imaging possible killer defects using said highest resolution, and classifying said possible defects in at least partial dependence on said re-imaging.

37. A substrate lithography and inspection tool, comprising:
a substrate stage;
multiple charged particle beam columns, individual ones of said columns configured to produce an individual charged particle beam, different ones of said columns having different writing areas; and
one or more column controllers storing instructions in a computer-readable non-transitory medium that, when executed, direct said beam controllers to:
control said columns to write multiple high-order Hadamard targets in multiple writing areas on the substrate;
control said columns to image multiple features in said high-order Hadamard targets;
measure performance in at least partial dependence on said imaging, and determine which of said features were correctly imaged;
until one or more features of a threshold size are correctly imaged, modify beam parameters of said columns in at least partial dependence on said measuring to stochastically improve beam performance, and controlling said columns to repeat said image multiple target features action, said measure action and said determine action, targeting one or more features in said repeated image action that are smaller than those previously determined as correctly imaged; and
controlling said columns to image multiple cut features on the substrate using said columns with said modified beam parameters.

38. The substrate lithography and inspection tool of claim 37, wherein said beam parameters are selected from: beam energy, beam focus, exposure time, beam current, beam landing energy, beam size, and beam scan rate.

39. The substrate lithography and inspection tool of claim 37, wherein said measuring uses criteria selected from: beam resolution, contrast, signal-to-noise ratio, edge-sharpness, and deflection accuracy.

40. The substrate lithography and inspection tool of claim 37, wherein said targets are generated using the discrete Hadamard and/or Walsh transform basis kernels using $N \geq 10$.

41. The substrate lithography and inspection tool of claim 37, wherein said targets are configured such that, using initial and/or non-optimized beam parameters, at least some features of said targets can be correctly imaged and at least some target features cannot be correctly imaged.

42. The substrate lithography and inspection tool of claim 37, wherein said image multiple target features action, said measure and determine actions, and said modify and repeat actions are repeated multiple times on one or more different substrates, prior to said imaging cut features action, using multiple different high-order Hadamard targets comprising either or both of (1) a high-order Hadamard target with transposed blocks, or (2) multiple different Hadamard and/or Walsh transform-derived patterns.

43. The substrate lithography and inspection tool of claim 37, wherein if, within a specified number of iterations of said modify and repeat actions or a specified amount of time, said measured beam performance of a particular one of said columns fails to reach a pass threshold or decreases significantly with respect to prior measured beam performance, or said particular column fails to correctly image features of said threshold size, then said particular column is inspected for defects and/or repaired and/or replaced.

44. The substrate lithography and inspection tool of claim 37, wherein columns with similar said measured beam performance, from multiple different arrays of columns, are placed into a single array of columns, and said single array of columns is used to write and/or to inspect multiple cut features on one or more substrates.

45. The substrate lithography and inspection tool of claim 37, wherein said image multiple target features action, said measure and determine actions, and said modify and repeat actions are repeated until the rate of improvement in measured beam performance and/or the rate of decrease in correctly imaged feature size falls below a threshold rate.

* * * * *